(12) United States Patent
Lee

(10) Patent No.: US 11,533,060 B2
(45) Date of Patent: Dec. 20, 2022

(54) MULTIPATH SAMPLING CIRCUITS

(71) Applicant: Omni Design Technologies Inc., Milpitas, CA (US)

(72) Inventor: Hae-Seung Lee, Lexington, MA (US)

(73) Assignee: Omni Design Technologies, Inc., Milpitas, CA (US)

( * ) Notice: Subject to any disclaimer, the term of this patent is extended or adjusted under 35 U.S.C. 154(b) by 0 days.

(21) Appl. No.: 17/446,675

(22) Filed: Sep. 1, 2021

(65) Prior Publication Data

US 2022/0069833 A1    Mar. 3, 2022

Related U.S. Application Data

(60) Provisional application No. 63/072,985, filed on Sep. 1, 2020.

(51) Int. Cl.
*H03M 1/00* (2006.01)
*H03M 1/12* (2006.01)

(52) U.S. Cl.
CPC ....... *H03M 1/1245* (2013.01); *H03M 1/1205* (2013.01)

(58) Field of Classification Search
CPC .... H03M 1/1245; H03M 1/1205; H03M 1/12; H03M 1/22
USPC ................................................ 341/122, 159
See application file for complete search history.

(56) References Cited

U.S. PATENT DOCUMENTS

| | | |
|---|---|---|
| 4,845,382 A | 7/1989 | Eouzan et al. |
| 5,729,178 A | 3/1998 | Park et al. |
| 5,757,857 A | 5/1998 | Buchwald |
| 2014/0048682 A1 | 2/2014 | Kim et al. |
| 2014/0070971 A1 | 3/2014 | Zabroda |
| 2015/0084800 A1 | 3/2015 | Zhang et al. |
| 2016/0105195 A1 | 4/2016 | Mulder |
| 2017/0285833 A1* | 10/2017 | Shahrokhi ............. G06F 3/0446 |
| 2019/0222175 A1* | 7/2019 | Khlat ..................... H03F 3/189 |
| 2021/0281271 A1 | 9/2021 | Bales et al. |
| 2021/0281272 A1 | 9/2021 | Singh et al. |

(Continued)

OTHER PUBLICATIONS

W. C. Black et al., "Time-interleaved converter arrays", IEEE J. Solid-State Circuits, Dec. 1980, pp. 1022-1029, vol. 15, No. 12, IEEE.

(Continued)

*Primary Examiner* — Peguy Jean Pierre
(74) *Attorney, Agent, or Firm* — Intrinsic Law Corp.

(57) ABSTRACT

A multipath sampling circuit includes an input line electrically having an input voltage, a plurality of voltage amplifiers in parallel electrically with one another, each voltage amplifier having a respective input electrically coupled in series with the input line, each voltage amplifier having a different gain and a different saturation voltage; and a plurality of track-and-hold circuits. The track-and-hold circuits have a first state in which a respective input of each track-and-hold circuit is electrically coupled to an output of a respective amplifier. The track-and-hold circuits have a second state in which the respective input of each track-and-hold circuit is electrically decoupled from the output of the respective amplifier. The track-and-hold circuits can be electrically coupled to a summing circuit, a buffer amplifier, or an operational amplifier.

30 Claims, 21 Drawing Sheets

(56) References Cited

U.S. PATENT DOCUMENTS

2021/0351781 A1   11/2021   Daly et al.

OTHER PUBLICATIONS

B. Razavi, "Design Considerations for Interleaved ADCs", IEEE J. Solid-State Circuits, Aug. 2013, pp. 1806-1817, vol. 48, No. 8, IEEE.

N. Kurosawa et al., "Explicit analysis of channel mismatch effects in time-interleaved ADC systems", IEEE Transactions on Circuits and Systems 1: Fundamental Theory and Applications, Mar. 2001, pp. 261-271, vol. 48, No. 3, IEEE.

R. Jewett et al, "A 12b 128MSamplels ADC with 0.05LSB DNL," IEEE International Solid-State Circuits Conference Digest of Technical Papers, Feb. 1997, pp. 138-139, IEEE.

K. Poulton et al., "A20GS/S 8b ADC with a 1MB Memory in 0.18,um CMOS", Dig. Tch. Papers, 2003, pp. 318-319, ISSCC.

J. Elbornsson et al., "Blind estimation of timing errors in interleaved AD converters", IEEE International Conference on Acoustics, Speech, and Signal Processing. Proceedings (Cat. No. 01CH37221), 2001, pp. 3913-3916, vol. 6, Salt Lake City, UT, USA.

M. El-Chammas et al., "A 12-GS/s 81-mW 5-bit Time-Interleaved Flash ADC With Background Timing Skew Calibration", J. Solid-State Circuits, Apr. 2011, pp. 838-847, vol. 46, No. 4, IEEE.

S. Devarajan et al.," A 12-b 10-GS/s Interleaved Pipeline ADC in 28-nm CMOS Technology", J. Solid-State Circuits, Dec. 2017, pp. 3204-3218, vol. 52, No. 12, IEEE.

S. Lee et al., "A 1GS/s 10b 18.9mW time-interleaved SAR ADC with background timing-skew calibration," International Solid-State Circuits Conference Digest of Technical Papers, Feb. 2014, pp. 384-385, IEEE.

M. Tamba et al., "A method to improve SFDR with random interleaved sampling method", Proceedings International Test Conference 2001 (Cat. No. 01CH37260), 2001, pp. 512-520, Baltimore, MD, USA.

J. Elbornsson et al., "Analysis of mismatch noise in randomly interleaved ADC system", International Conference on Acoustics, Speech, and Signal Processing, 2003. Proceedings. (ICASSP '03)., 2003, pp. VI-280, IEEE.

ISR, "International Search Report", PCT/US21/71337, dated Feb. 16, 2022.

\* cited by examiner

MULTIPATH SAMPLING CIRCUITS

CROSS-REFERENCE TO RELATED APPLICATIONS

This application claims priority to U.S. Provisional Application No. 63/072,985, titled "Multipath Sampling Circuits," filed on Sep. 1, 2020, which is hereby incorporated by reference.

TECHNICAL FIELD

This application generally relates to sampling, sample-and-hold, track-and-hold, and analog-to-digital conversion circuits.

BACKGROUND

Sampling circuits such as sample-and-hold circuits (SHCs) and track-and-hold circuits (THCs) are widely used to convert continuous-time signals to discrete-time signals. These discrete-time signals are often converted to digital data by analog-to-digital converters (ADCs). Many ADCs have implicit sampling circuits. For example, a successive approximation register (SAR) ADC typically samples the input voltage on a capacitor array digital-to-analog converter (DAC) instead of sampling on an explicit sampling circuit. The sampling circuits capture continuous-time analog signals and hold it at the same level for an extended period of time. The signals may be held in voltage, charge, or current. For example, an SHC may be placed in front of an analog-to-digital converter such that the signal applied to the input of the ADC is held constant until the conversion is complete. A block diagram showing a representative system 10 is shown in FIG. 1.

Conventional sampling circuits have a linear input-to-output characteristic.

$$V_o(n) = a v_{IN}(t=t_n) \quad (1)$$

where $V_o(n)$ is a discrete-time output voltage, $v_{IN}(t)$ a continuous-time input voltage, and a is a gain. FIG. 2 shows a transfer function 20 of such a sampling circuit with two different gains, a=1 (solid line) and a=0.5 (dotted line). Such a linear characteristic presents a problem when the input signal has a wide dynamic range, e.g., a large ratio between the largest and the smallest input signals.

Sampling circuits and ADCs have limited range of the input and output signals beyond which the output saturates. For example, for the solid line (a=1) in FIG. 2, the linear characteristic holds only up to the input voltage of $v_{IN}=V_1$. For the input range $v_{IN}>V_1$, the output voltage saturates at $V_1$, and no longer responds to the changes of the input voltage. Therefore, if the range of the input voltage exceeds $V_1$, the sampling circuit is unable to reproduce the input voltage beyond $V_1$. One method to increase the input range is to reduce the gain. In FIG. 2, the dotted line saturates only if the input voltage exceeds $2V_1$, thereby permitting twice the range of the input voltage. The drawback of the reduced gain is that the noise in the circuits following the sampling circuit, e.g. an ADC, is increased by a factor 2 when referred to the input of the sampling circuit. This is undesirable because it is costly to reduce noise in ADCs.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention.

An aspect of the invention is directed to a multipath sampling circuit comprising: an input line electrically having an input voltage; a plurality of voltage amplifiers in parallel electrically with one another, each voltage amplifier having a respective input electrically coupled with the input line, each voltage amplifier having a different gain and a different saturation voltage; a plurality of track-and-hold circuits; a shorting line electrically coupled to a respective output of each sample-and-hold circuit; a shorting switch electrically coupled to the shorting line; a buffer amplifier having an input electrically coupled to the shorting line. The multipath sampling circuit has a tracking phase and a hold phase. When the multipath sampling circuit is in the tracking phase: the shorting switch is in an open state, and the track-and-hold circuits are in a first state in which a respective input of each track-and-hold circuit is electrically coupled to an output of a respective amplifier. When the multipath sampling circuit is in the hold phase: the shorting switch is in a closed state, and the track-and-hold circuits are in a second state in which the respective input of each track-and-hold circuit is electrically decoupled from the output of the respective amplifier.

In one or more embodiments, the circuit further comprises a plurality of sampling switches; and a plurality of sampling capacitors. Each track-and-hold circuit includes a respective sampling switch and a respective sampling capacitor. When the track-and-hold circuits are in the first state, the sampling switches are in a closed state such that each sampling capacitor is electrically coupled to the output of the respective amplifier. When the track-and-hold circuits are in the second state, the sampling switches are in an open state such that each sampling capacitor is electrically decoupled from the output of the respective amplifier.

In one or more embodiments, the voltage amplifiers include first and second voltage amplifiers, the track-and-hold circuits include first and second track-and-hold circuits, the gain of the first voltage amplifier is greater than the gain of the second voltage amplifier, and the saturation voltage of the first voltage amplifier is lower than the saturation voltage of the second voltage amplifier. In one or more embodiments, the gain of the first voltage amplifier is at least twice the gain of the second voltage amplifier, and the saturation voltage of the first voltage amplifier is lower than or equal to half of the saturation voltage of the second voltage amplifier.

In one or more embodiments, the first track-and-hold circuit includes a first sampling switch and a first sampling capacitor, the second track-and-hold circuit includes a second sampling switch and a second sampling capacitor, when the track-and-hold circuits are in the first state, the first and second sampling switches are in a closed state such that the first and second sampling capacitors are electrically coupled to the output of the first and second voltage amplifiers, respectively, and when the track-and-hold circuits are in the second state, the first and second sampling switches are in an open state such that the first and second sampling capacitors are electrically decoupled from the output of the first and second voltage amplifiers, respectively. In one or more embodiments, when the input voltage ($V_{IN}$) is lower than the saturation voltage ($V_1$) of the first voltage amplifier, a voltage ($V_o$) at an output of the buffer amplifier is equal to $$\frac{(C_1 a_1 + C_2 a_2)}{C_1 + C_2} v_{IN},$$

when $V_{IN}$ is greater than or equal to $V_1$ and less than or equal to the saturation voltage ($V_2$) of the second voltage amplifier, $V_o$ is equal to $$\frac{(C_1 a_1 V_1 + C_2 a_2 v_{IN})}{C_1 + C_2},$$

and when $V_{IN}$ is greater than $V_2$, $V_o$ is equal to $$\frac{(C_1 a_1 V_1 + C_2 a_2 V_2)}{C_1 + C_2},$$

where: $a_1$ is the gain of the first voltage amplifier, $a_2$ is the gain of the second voltage amplifier, $C_1$ is a capacitance of the first sampling capacitor, $C_2$ is a capacitance of the second sampling capacitor, and $V_o$ is measured during the hold phase of the multipath sampling circuit.

Another aspect of the invention is directed to a multipath sampling circuit comprising: an input line having an input voltage; a plurality of voltage amplifiers in parallel electrically with one another, each voltage amplifier having a respective input electrically coupled with the input line, each voltage amplifier having a different gain and a different saturation voltage; a plurality of track-and-hold circuits; a sampling circuit electrically coupled to a respective output of each sample-and-hold circuit, the sampling circuit including a sampling switch having an open state and a closed state; an operational amplifier having a differential input and an output, the differential input of the operational amplifier electrically coupled to the shorting line. The multipath sampling circuit has a tracking phase and a hold phase. When the multipath sampling circuit is in the tracking phase: the track-and-hold circuits are in a first state in which a respective output of each voltage amplifier is electrically coupled to the shorting line, and the sampling switch is in the closed state. When the multipath sampling circuit is in the hold phase: the track-and-hold circuits are in a second state in which the respective output of each voltage amplifier is electrically decoupled from the shorting line, and the sampling switch is in the open state.

In one or more embodiments, the sampling circuit is electrically coupled to an inverting side of the differential input, and a non-inverting side of the differential input is electrically coupled to ground. In one or more embodiments, the voltage amplifiers include first and second voltage amplifiers, the track-and-hold circuits include first and second track-and-hold circuits, the gain of the first voltage amplifier is greater than the gain of the second voltage amplifier, and the saturation voltage of the first voltage amplifier is lower than the saturation voltage of the second voltage amplifier.

In one or more embodiments, the first track-and-hold circuit includes a first tracking switch and a first sampling capacitor, the second track-and-hold circuit includes a second tracking switch and a second sampling capacitor, when the first and second track-and-hold circuits are in the first state, the first and second tracking switches are in a first state such that the first and second sampling capacitors are electrically coupled to the output of the first and second voltage amplifiers, respectively, and when the first and second track-and-hold circuits are in the second state, the first and second tracking switches are in a second state such that the first and second sampling capacitors are electrically decoupled from the output of the first and second voltage amplifiers, respectively. In one or more embodiments, in the second state the first and second tracking switches electrically couple the first and second sampling capacitors to a respective feedback line that is electrically coupled to the output of the operational amplifier. In one or more embodiments, when the input voltage ($V_{IN}$) is lower than the saturation voltage ($V_1$) of the first voltage amplifier, a voltage ($V_o$) at the output of the operational amplifier is equal to $$\frac{(C_1 a_1 + C_2 a_2)}{C_1 + C_2} v_{IN},$$

when $V_{IN}$ is greater than or equal to $V_1$ and less than or equal to the saturation voltage ($V_2$) of the second voltage amplifier, $V_o$ is equal to $$\frac{(C_1 a_1 V_1 + C_2 a_2 v_{IN})}{C_1 + C_2},$$

and when $V_{IN}$ is greater than $V_2$, $V_o$ is equal to $$\frac{(C_1 a_1 V_1 + C_2 a_2 V_2)}{C_1 + C_2},$$

where: $a_1$ is the gain of the first voltage amplifier, $a_2$ is the gain of the second voltage amplifier, $C_1$ is a capacitance of the first sampling capacitor, $C_2$ is a capacitance of the second sampling capacitor, and $V_o$ is measured during the hold phase of the multipath sampling circuit.

In one or more embodiments, the sampling circuit further comprises a feedback capacitor having a first terminal electrically coupled to the sampling circuit; and a ground switch. When the multipath sampling circuit is in the tracking phase, the ground switch is in a first state in which a second terminal of the feedback capacitor is electrically coupled to ground. When the multipath sampling circuit is in the hold phase: the first and second tracking switches electrically couple the first and second sampling capacitors, respectively, to ground, and the ground switch is in a second state in which the second terminal of the feedback capacitor is electrically coupled to a feedback line, the feedback line electrically coupled to the output of the operational amplifier and to the sampling circuit. In one or more embodiments, when the input voltage ($V_{IN}$) is lower than the saturation voltage ($V_1$) of the first voltage amplifier, a voltage ($V_o$) at the output of the operational amplifier is equal to $$\frac{(C_1 a_1 + C_2 a_2)}{C_3} v_{IN},$$

when $V_{IN}$ is greater than or equal to $V_1$ and less than or equal to the saturation voltage ($V_2$) of the second voltage amplifier, $V_o$ is equal to $$\frac{(C_1 a_1 V_1 + C_2 a_2 v_{IN})}{C_3},$$

and when $V_{IN}$ is greater than $V_2$, $V_o$ is equal to $$\frac{(C_1 a_1 V_1 + C_2 a_2 V_2)}{C_3},$$

where: $a_1$ is the gain of the first voltage amplifier, $a_2$ is the gain of the second voltage amplifier, $C_1$ is a capacitance of the first sampling capacitor, $C_2$ is a capacitance of the second sampling capacitor, $C_3$ is a capacitance of the feedback capacitor, and $V_x$ is measured during the hold phase of the multipath sampling circuit.

In one or more embodiments, the sampling circuit further comprises a first shorting line electrically coupled to the respective output of each sample-and-hold circuit, the first shorting line electrically coupled to an inverting side of the differential input of the operational amplifier; a second shorting line that electrically connects a first feedback line to the shorting line; and the sampling switch has a first terminal electrically connected to a first side of the second shorting line and a second terminal electrically connected to a second side of the second shorting line. When the sampling switch is in the closed state, the sampling switch electrically couples the first and second sides of the second shorting line, thereby electrically coupling the inverting side of the differential input of the operational amplifier to the output of the operational amplifier. When the sampling switch is in the open state, the sampling switch electrically decouples the first and second sides of the second shorting line, thereby electrically decoupling the inverting side of the differential input of the operational amplifier to the output of the operational amplifier.

In one or more embodiments, the sampling circuit comprises a shorting line electrically coupled to the respective output of each sample-and-hold circuit, the sampling switch electrically coupled to the shorting line, wherein: when the sampling circuit is in the first state, the sampling switch is in a closed state in which the sampling circuit is electrically coupled to ground, and when the sampling circuit is in the second state, the sampling switch is in an open state in which the sampling switch is electrically decoupled from ground. In one or more embodiments, the plurality of voltage amplifiers have different frequency responses.

Yet another aspect of the invention is directed to a multipath sampling circuit comprising: an input line having an input voltage; a plurality of voltage amplifiers in parallel electrically with one another, each voltage amplifier having a respective input electrically coupled with the input line, each voltage amplifier having a different gain and a different saturation voltage; a plurality of track-and-hold circuits including a first track-and-hold circuit group and a second track-and-hold circuit group, each track-and-hold circuit having a respective input and a respective output; a sampling circuit having a first side electrically coupled to each track-and-hold circuit in the first track-and-hold circuit group and a second side electrically coupled to each sample-and-hold circuit in the second track-and-hold circuit group, the sampling circuit having a first state in which the first and second sides of the sampling circuit are electrically coupled and a second state in which the first and second sides of the sampling circuit are electrically decoupled; and an operational amplifier having a differential input in which (a) a first side of the differential input of the operational amplifier is electrically coupled to the first side of the sampling circuit and (b) a second side of the differential input of the operational amplifier is electrically coupled to the second side of the sampling circuit. The multipath sampling circuit has a tracking phase and a hold phase. When the multipath sampling circuit is in the tracking phase: the track-and-hold circuits in the first track-and-hold circuit group are in a first state in which a first side of a differential output of each voltage amplifier is electrically coupled to the first side of the sampling circuit, the track-and-hold circuits in the first track-and-hold circuit group are in a first state in which a second side of the differential output of each voltage amplifier is electrically coupled to the second side of the sampling circuit, and the sampling circuit is in the first state. When the multipath sampling circuit is in the hold phase: the respective input of each track-and-hold circuit in the first track-and-hold circuit group is electrically coupled to a first feedback line that is electrically coupled to a first side of a differential output of the operational amplifier, the respective input of each track-and-hold circuit in the second track-and-hold circuit group is electrically coupled to a second feedback line that is electrically coupled to a second side of the differential output of the operational amplifier, and the sampling circuit is in the second state.

In one or more embodiments, the voltage amplifiers include first and second voltage amplifiers, the first track-and-hold circuit group includes first and second track-and-hold circuits, the second track-and-hold circuit group includes third and fourth track-and-hold circuits, the gain of the first voltage amplifier is greater than the gain of the second voltage amplifier, and the saturation voltage of the first voltage amplifier is less than the saturation voltage of the second voltage amplifier. In one or more embodiments, the first track-and-hold circuit includes a first sampling switch and a first sampling capacitor, the second track-and-hold circuit includes a second sampling switch and a second sampling capacitor, the third track-and-hold circuit includes a third sampling switch and a third sampling capacitor, the fourth track-and-hold circuit includes a fourth sampling switch and a fourth sampling capacitor, when the first, second, third, and fourth track-and-hold circuits are in the first state, the first, second, third, and fourth sampling switches are in a first state such that (a) a respective first terminal of the first and second sampling capacitors is electrically coupled to the first side of the differential output of the first and second voltage amplifiers, respectively and (b) a respective first terminal of the third and fourth sampling capacitors is electrically coupled to the second side of the differential output of the first and second voltage amplifiers, respectively, and when the first, second, third, and fourth track-and-hold circuits are in the second state, the first and second sampling switches are in a second state such that (a) the respective first terminal of the first and second sampling capacitors is electrically coupled to the first feedback line and (b) the respective first terminal of the third and fourth sampling capacitors is electrically coupled to the second feedback line.

In one or more embodiments, the first side of the differential output of the first and second voltage amplifiers is a non-inverting side, the second side of the differential output of the first and second voltage amplifiers is an inverting side, when an absolute value of the input voltage ($V_{IN}$) is lower than the saturation voltage ($V_1$) of the first voltage amplifier, a voltage ($V_o$) across the first and second sides of the differential output of the operational amplifier is equal to $$\frac{(C_1 a_1 + C_2 a_2)}{C_1 + C_2} v_{IN},$$

when the absolute value of $V_{IN}$ is greater than or equal to $V_1$ and less than or equal to the saturation voltage ($V_2$) of the second voltage amplifier, $V_o$ is equal to $$\frac{(C_1 a_1 V_1 + C_2 a_2 v_{IN})}{C_1 + C_2},$$

and when $V_{IN}$ is greater than $V_2$, $V_o$ is equal to $$\frac{(C_1 a_1 V_1 + C_2 a_2 V_2)}{C_1 + C_2},$$

where: $a_1$ is the gain of the first voltage amplifier, $a_2$ is the gain of the second voltage amplifier, $C_1$ is a capacitance of the first and third sampling capacitors, $C_2$ is a capacitance of the second and fourth sampling capacitors, and $V_o$ is measured during the hold phase of the track-and-hold circuits.

Another aspect of the invention is directed to a multipath sampling circuit comprising: an input line having an input voltage; a plurality of voltage amplifiers in parallel electrically with one another, each voltage amplifier having a respective input electrically coupled with the input line, each voltage amplifier having a different gain and a different saturation voltage; and an analog-to-digital converter (ADC) comprising: a plurality of track-and-hold circuits; a shorting line electrically coupled to each sample-and-hold circuit; a plurality of ADC control lines; a sampling switch having a closed state in which the shorting line is electrically coupled to ground and an open state in which the shorting line is electrically decoupled from ground; and ADC control circuitry electrically coupled to the shorting line and to the ADC control lines. The ADC has a tracking phase and a conversion phase. When the ADC is in the tracking phase: the track-and-hold circuits are in a first state in which a respective output of each voltage amplifier is electrically coupled to the shorting line, and the sampling switch is in the closed state. When the ADC is in the conversion phase: the track-and-hold circuits are in a second state in which the shorting line is electrically coupled to a respective ADC control line, and the sampling switch is in the open state.

In one or more embodiments, the voltage amplifiers include first and second voltage amplifiers, the track-and-hold circuits include first and second track-and-hold circuits, the ADC control lines includes first and second ADC control lines, the gain of the first voltage amplifier is greater than the gain of the second voltage amplifier, and the saturation voltage of the first voltage amplifier is less than the saturation voltage of the second voltage amplifier. In one or more embodiments, the gain of the first voltage amplifier is at least twice the gain of the second voltage amplifier, and the saturation voltage of the first voltage amplifier is less than or equal to half of the saturation voltage of the second voltage amplifier. In one or more embodiments, the first track-and-hold circuit includes a first sampling switch and a first sampling capacitor, the second track-and-hold circuit includes a second sampling switch and a second sampling capacitor, when the track-and-hold circuits are in the first state, the first and second sampling switches are in a first state in which a respective first terminal of the first and second sampling capacitors is electrically coupled to the respective output of the first and second voltage amplifiers, respectively, and when the track-and-hold circuits are in the second state, the first and second sampling switches are in a second state in which the respective first terminal of the first and second sampling capacitors is electrically coupled to the first and second ADC control lines, respectively.

In one or more embodiments, when the input voltage ($V_{IN}$) is lower than the saturation voltage ($V_1$) of the first voltage amplifier, a digital output ($D_o$) of the ADC control circuitry is equal or close to $$\frac{C_1 a_1 + C_2 a_2}{C_1 + C_2} \cdot \frac{v_{IN}}{V_{REF}},$$

when $V_{IN}$ is greater than or equal to $V_1$ and less than or equal to the saturation voltage ($V_2$) of the second voltage amplifier, $D_o$ is equal or close to $$\frac{(C_1 a_1 V_1 + C_2 a_2 v_{IN})}{(C_1 + C_2) V_{REF}},$$

and when $V_{IN}$ is greater than $V_2$, $D_o$ is equal or close to $$\frac{(C_1 a_1 V_1 + C_2 a_2 V_2)}{(C_1 + C_2) V_{REF}},$$

where: $a_1$ is the gain of the first voltage amplifier, $a_2$ is the gain of the second voltage amplifier, $C_1$ is a capacitance of the first sampling capacitor, $C_2$ is a capacitance of the second sampling capacitor, $V_{REF}$ is a full-scale voltage of the ADC, and $D_o$ is measured during the conversion phase of the ADC.

Yet another aspect of the invention is directed to a multipath sampling circuit comprising: an input line electrically having an input voltage; a plurality of voltage amplifiers in parallel electrically with one another, each voltage amplifier having a respective input electrically coupled with the input line, each voltage amplifier having a different gain and a different saturation voltage; a plurality of track-and-hold circuits; and a summing circuit electrically coupled to the track-and-hold circuits. The multipath sampling circuit has a tracking phase and a hold phase. When the multipath sampling circuit is in the tracking phase, the track-and-hold circuits are in a first state in which a respective input of each track-and-hold circuit is electrically coupled to an output of a respective amplifier. When the multipath sampling circuit is in the hold phase, the track-and-hold circuits are in a first state in which the respective input of each track-and-hold circuit is electrically decoupled from the output of the respective amplifier.

In one or more embodiments, the voltage amplifiers include first and second voltage amplifiers, the track-and-hold circuits include first and second track-and-hold circuits, the first track-and-hold circuit includes a first tracking switch and a first sampling capacitor, the second track-and-hold circuit includes a second tracking switch and a second sampling capacitor, when the first and second track-and-hold circuits are in the first state, the first and second tracking switches are in a first state such that the first and second sampling capacitors are electrically coupled to the output of the first and second voltage amplifiers, respectively, when the first and second track-and-hold circuits are in the second state, the first and second tracking switches are in a second state such that the first and second sampling capacitors are electrically decoupled from the output of the first and second voltage amplifiers, respectively, the gain of the first voltage amplifier is greater than the gain of the second voltage amplifier, and the saturation voltage of the first voltage amplifier is lower than the saturation voltage of the second voltage amplifier.

In one or more embodiments, the summing circuit includes first and second summing amplifiers and an output summing node, an input of the first summing amplifier is electrically coupled to an output of the first track-and-hold circuit, an input of the second summing amplifier is electrically coupled to an output of the second track-and-hold circuit, and the output summing node is electrically coupled to an output of the first summing amplifier and an output of the second summing amplifier.

In one or more embodiments, when the input voltage ($V_{IN}$) is lower than the saturation voltage ($V_1$) of the first voltage amplifier, a voltage ($V_o$) at an output of the output summing node is equal to $(a_1 b_1 + a_2 b_2) V_{IN}$, when $V_{IN}$ is greater than or equal to $V_1$ and less than or equal to the saturation voltage ($V_2$) of the second voltage amplifier, $V_o$ is equal to $a_1 b_1 V_1 + a_2 b_2 V_{IN}$, and when $V_{IN}$ is greater than $V_2$, $V_o$ is equal to $a_1 b_1 V_1 + a_2 b_2 V_2$, where: $a_1$ is the gain of the first voltage amplifier, $a_2$ is the gain of the second voltage amplifier, $b_1$ is a voltage scale factor of the first summing amplifier, $b_2$ is a voltage scale factor of the second summing amplifier, and $V_o$ is measured during the hold phase of the multipath sampling circuit.

BRIEF DESCRIPTION OF THE DRAWINGS

For a fuller understanding of the nature and advantages of the concepts disclosed herein, reference is made to the detailed description of preferred embodiments and the accompanying drawings.

DETAILED DESCRIPTION

The inventor has recognized that it is advantageous to provide a nonlinear input-output characteristic in sampling circuits by using multipath sampling to permit wide dynamic range inputs without compromising noise performance of the entire system.

Figure 1:
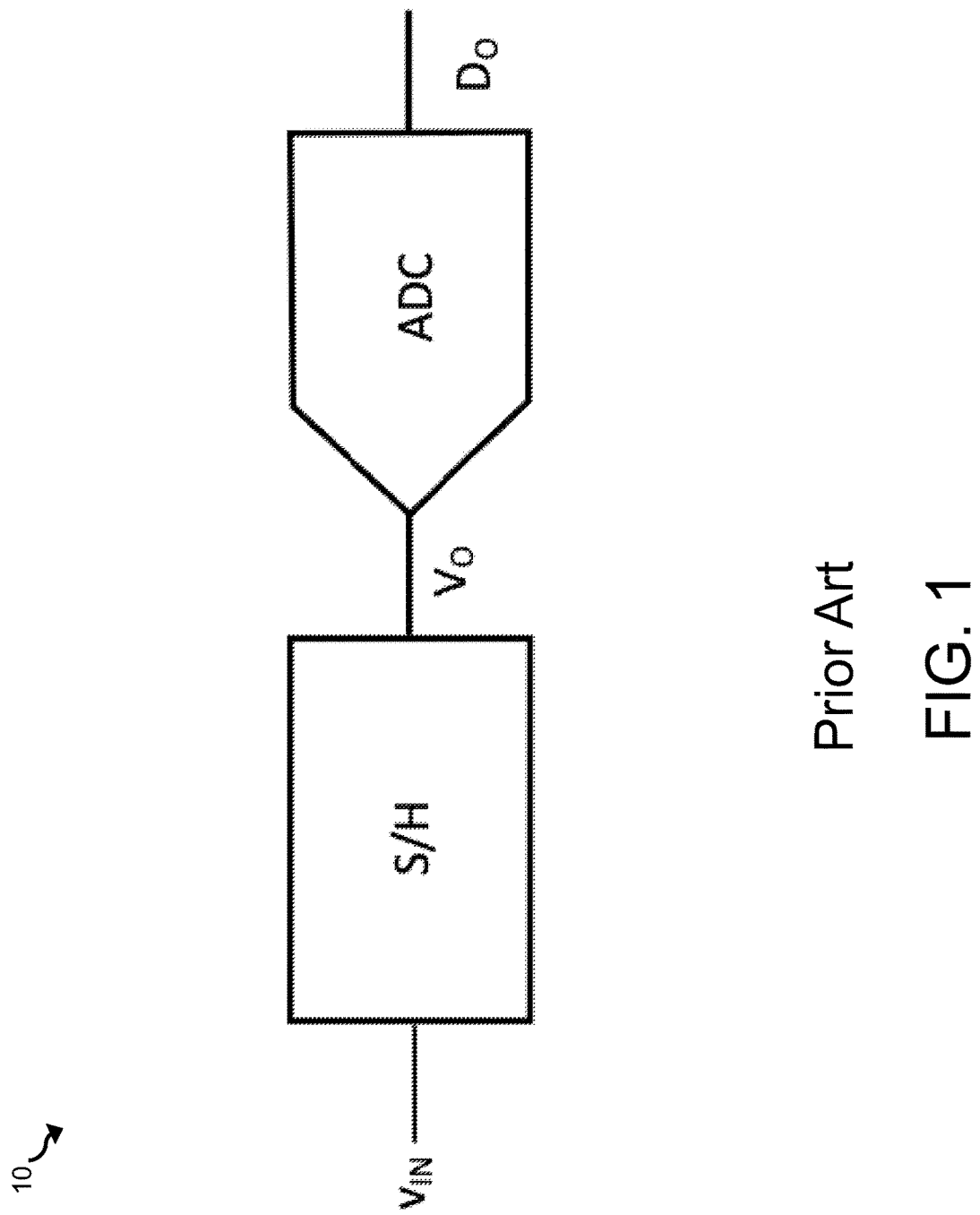
FIG. 1 is a block diagram showing a representative system according to the prior art.
Figure 2:
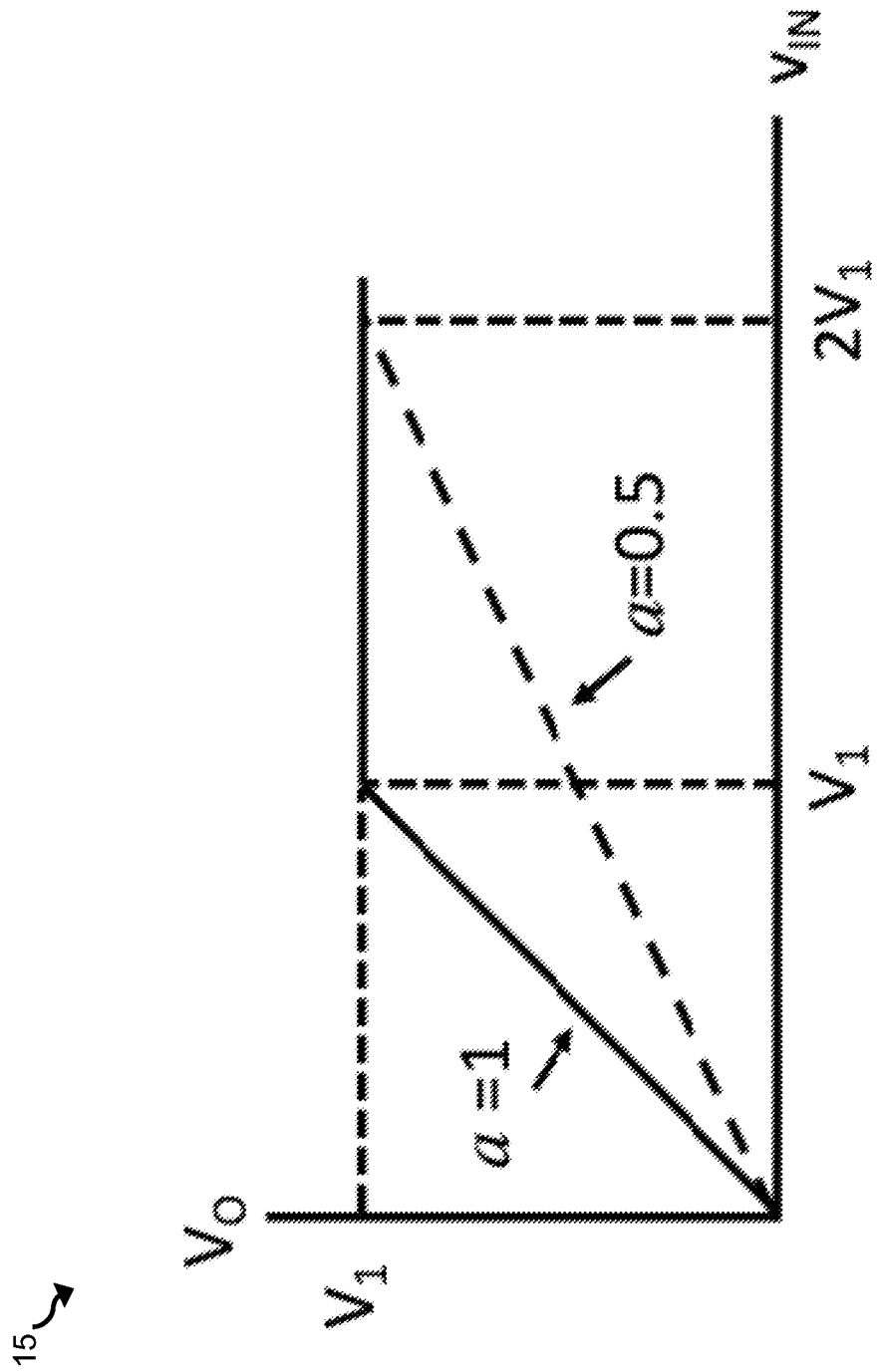
FIG. 2 is a graph of a transfer function of a sampling circuit with two different gains, according to the prior art.
Figure 3:
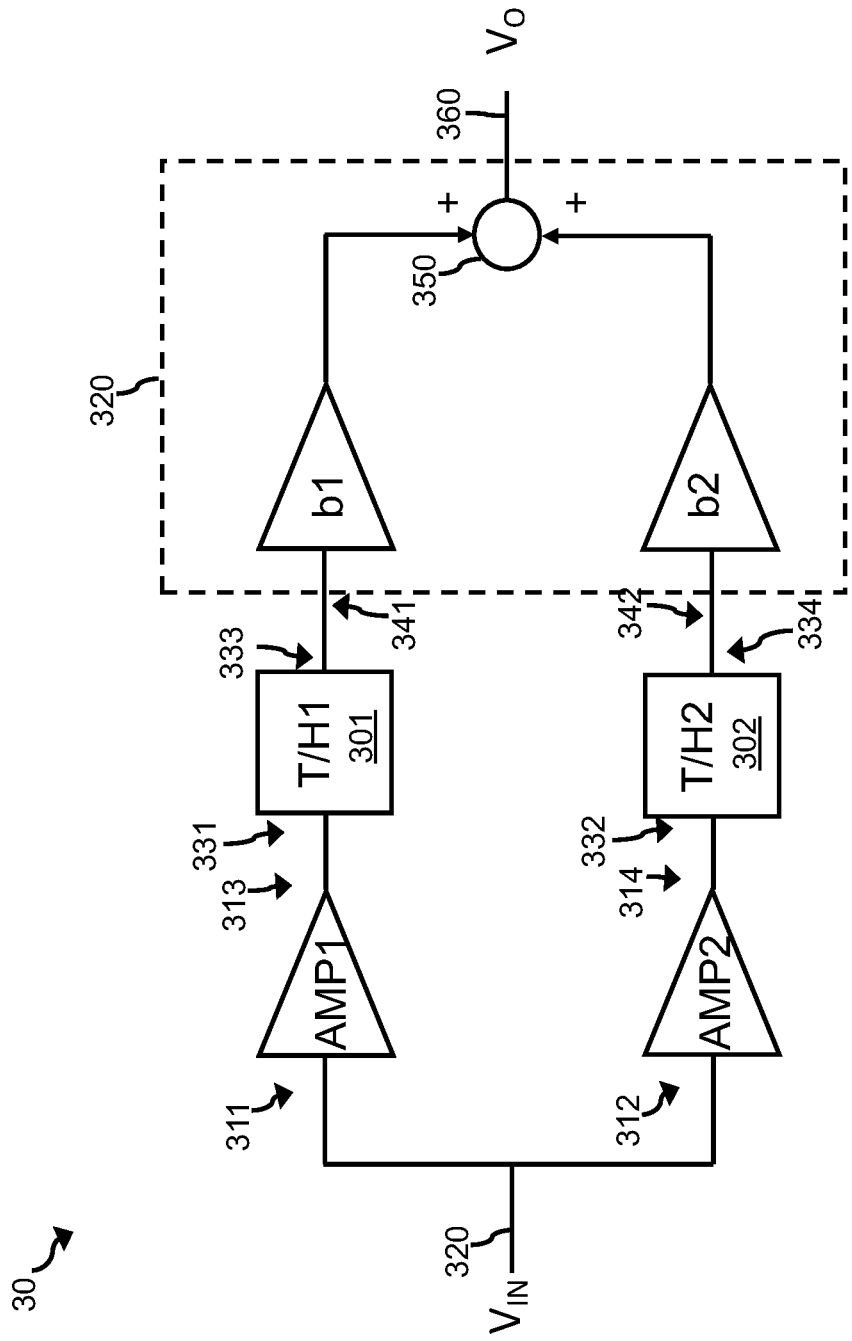
FIG. 3 is a schematic circuit diagram of a multipath sampling circuit according to a first embodiment of the invention.

FIG. 3 is a schematic circuit diagram of a multipath sampling circuit 30 according to a first embodiment of the invention. The multipath sampling circuit 30 comprises a first voltage amplifier AMP1, a second voltage amplifier AMP2, a first track-and-hold circuit 301, a second track-and-hold circuit 302, and a summing circuit 320. The first voltage amplifier AMP1 and the first track-and-hold circuit 301 are electrically coupled in parallel with the second voltage amplifier AMP2 and the second track-and-hold circuit 302.

The first and second voltage amplifiers AMP1, AMP2 have respective inputs 311, 312 that are electrically coupled in parallel to an input line 320 that has an input voltage $V_{IN}$. The inputs 331, 332 of the first and second track-and-hold circuits 301, 302 are electrically coupled to the outputs 313, 314 of the first and second voltage amplifiers AMP1, AMP2, respectively.

The summing circuit 320 includes two inputs 341, 342. The summing circuit may further include electronic components such as resistors or capacitors, which scale the voltages at the inputs 341 and 342 by coefficients b1 and b2, respectively, before summing them together to produce an output voltage $V_o$. b1 and b2 are predetermined coefficients in the summing circuit, which provide output voltage $V_o$ as a function of the input voltage given by Equations (6), (7), and (8).

The first and second track-and-hold circuits 301, 302 have a first state in which the outputs 313, 314 of the first and second voltage amplifiers AMP1, AMP2 are electrically coupled to the inputs 341, 342 of the summing circuit 320. The first and second track-and-hold circuits 301, 302 have a second state in which the outputs 313, 314 of the first and second voltage amplifiers AMP1, AMP2 are electrically decoupled from the inputs 341, 342 of the summing circuit 320.

Thus, the circuit 30 includes a plurality of voltage amplifiers, track-and-hold circuits, and a summing circuit that are electrically coupled with one another. In FIG. 3, there are 2 voltage amplifiers, 2 track-and-hold circuits, and a summing circuit. In other embodiments, there can be more 3, 4, 5, or another number (e.g., a positive integer greater than or equal to 2) of voltage amplifiers, track-and-hold circuits, and a summing circuit that are electrically coupled with one another. The output of each set or row of voltage amplifiers, track-and-hold circuits is electrically coupled to the summing circuit 320, as illustrated in FIG. 3. The input of each set or row of voltage amplifiers and track-and-hold circuits is electrically coupled to the input line 320.

Figure 4:
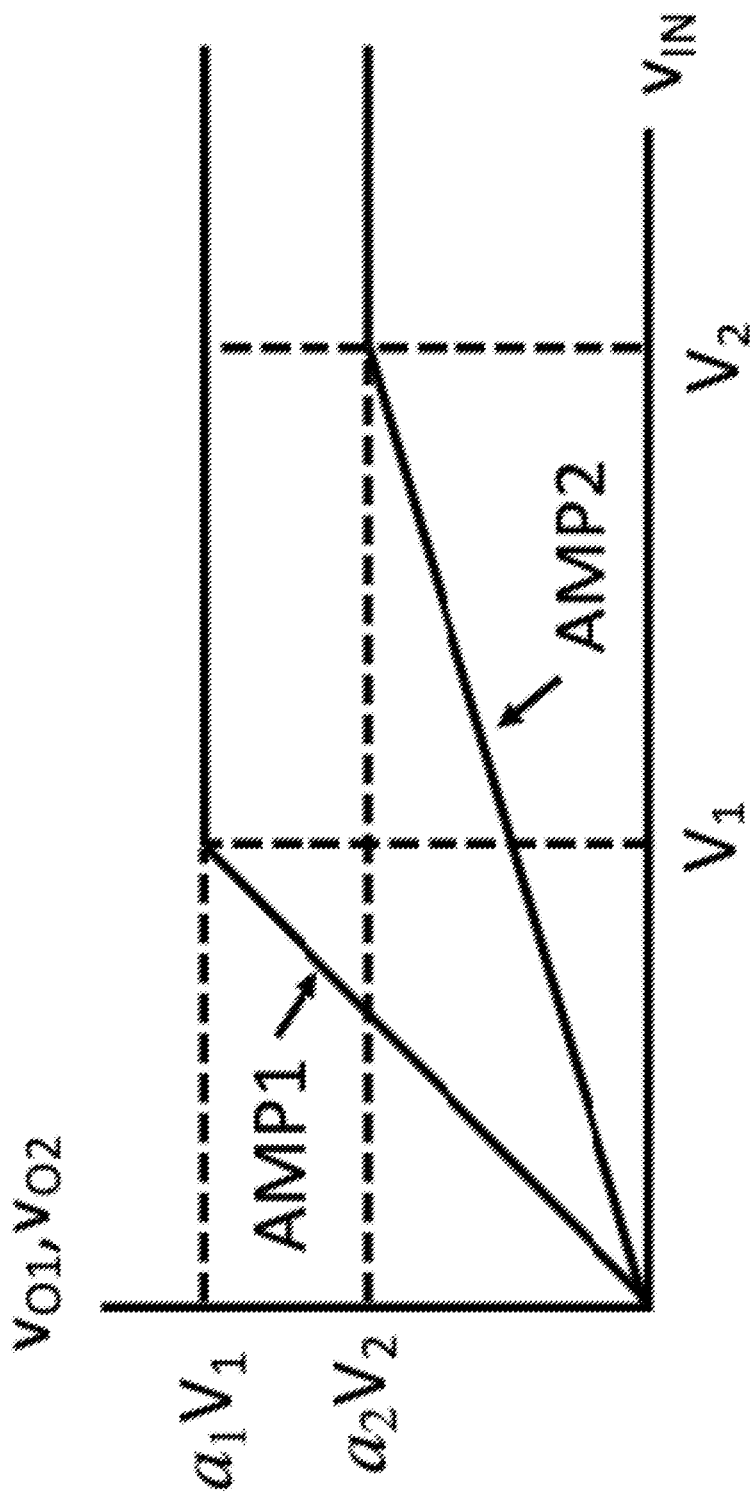
FIG. 4 is a graph of the output voltage of the first and second voltage amplifiers illustrated in FIG. 3 according to an embodiment.

As illustrated in FIG. 4, the output voltage $V_{o1}$ (e.g., at output 313) of the first voltage amplifier AMP1 can be characterized as follows:

$$v_{o1} = a_1 v_{IN}, v_{IN} < V_1 \quad (2)$$

$$v_{o1} = a_1 V_1, v_{IN} \geq V_1 \quad (3)$$

where $V_1$ is the saturation voltage of the first voltage amplifier AMP1 and $a_1$ is the gain of the first voltage amplifier AMP1. In other words, the first voltage amplifier AMP1 has a linear input range below $V_1$.

In addition the output voltage $V_{o2}$ (e.g., at output 314) of the second voltage amplifier AMP2 can be characterized as follows:

$$v_{o2} = a_2 v_{IN}, v_{IN} < V_2 \quad (4)$$

$$v_{o2} = a_2 V_2, v_{IN} \geq V_2 \quad (5)$$

where $V_2$ is the saturation voltage of the second voltage amplifier AMP2 and $a_2$ is the gain of the second voltage amplifier AMP2. In other words, the second voltage amplifier AMP2 has a linear input range below $V_2$.

As can be seen, $V_2$ is different (e.g., greater) than $V_1$. In some embodiments, $V_2$ can be at least twice (e.g., 2-10×) $V_1$. In addition, $a_2$ is different (e.g., less) than $a_1$. In some embodiments, $a_2$ can be less than or equal to half (e.g., 0.1-0.5×) of $a_1$.

During the hold phase, the output voltage $V_o$ at the output line can be shown to be:

$$v_o = (a_1 b_1 + a_2 b_2) v_{IN}, v_{IN} < V_1 \quad (6)$$

$$v_o = a_1 b_1 V_1 + a_2 b_2 v_{IN}, V_1 \leq v_{IN} \leq V_2 \quad (7)$$

$$v_o = a_1 b_1 V_1 + a_2 b_2 V_2, v_{IN} > V_2 \quad (8)$$

Figure 5:
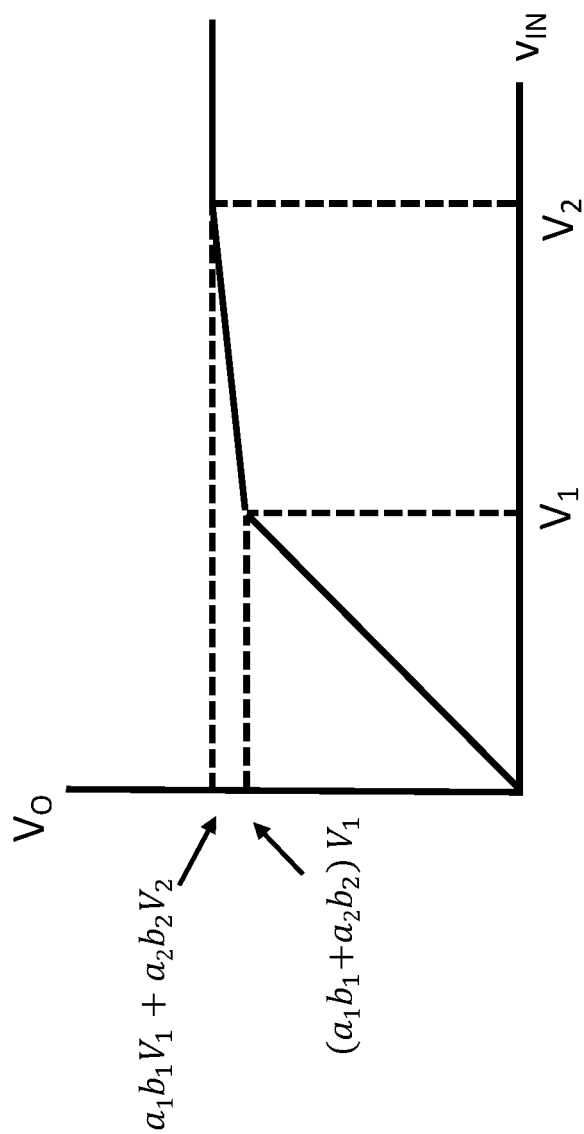
FIG. 5 is a graph of the output voltage of the multipath sampling circuit illustrated in FIG. 3 according to an embodiment.

These characteristics are graphically illustrated in FIG. 5. The output voltage increases linearly for the input voltage less than $V_1$ at a gain of $a_1 b_1 + a_2 b_2$, keeps increasing when the input voltage exceeds $V_1$ at a lower incremental gain of $a_2 b_2$. For the input voltage greater than $V_2$, the output saturates at $a_1 b_1 V_1 + a_2 b_2 V_2$. By properly choosing the values of $a_1$, $a_2$, $b_1$, and $b_2$, different breakpoints and incremental gains can be realized. Also, by employing additional sets or rows of voltage amplifiers, track-and-hold circuits, and summing amplifiers that are electrically coupled in parallel with one another, multiple sections of different gain regions may be realized. One of the benefits of the present invention is that the output of the sampling circuit 30 does not saturate at $V_1$ and provides a wider dynamic range than a conventional sampling circuit. In addition, since the gain is not reduced for the input signal $V_{IN}$ lower than $V_1$, noise performance is not compromised. Since the incremental gain is lower for input signals $V_{IN}$ greater than $V_1$, noise in the circuits following the sampling circuit 30 is increased when referred to the input $V_{IN}$ of the sampling circuit. However, since the input signal $V_{IN}$ is already large (e.g., greater than Win this case, it does not pose a problem in most systems.

Figure 6:
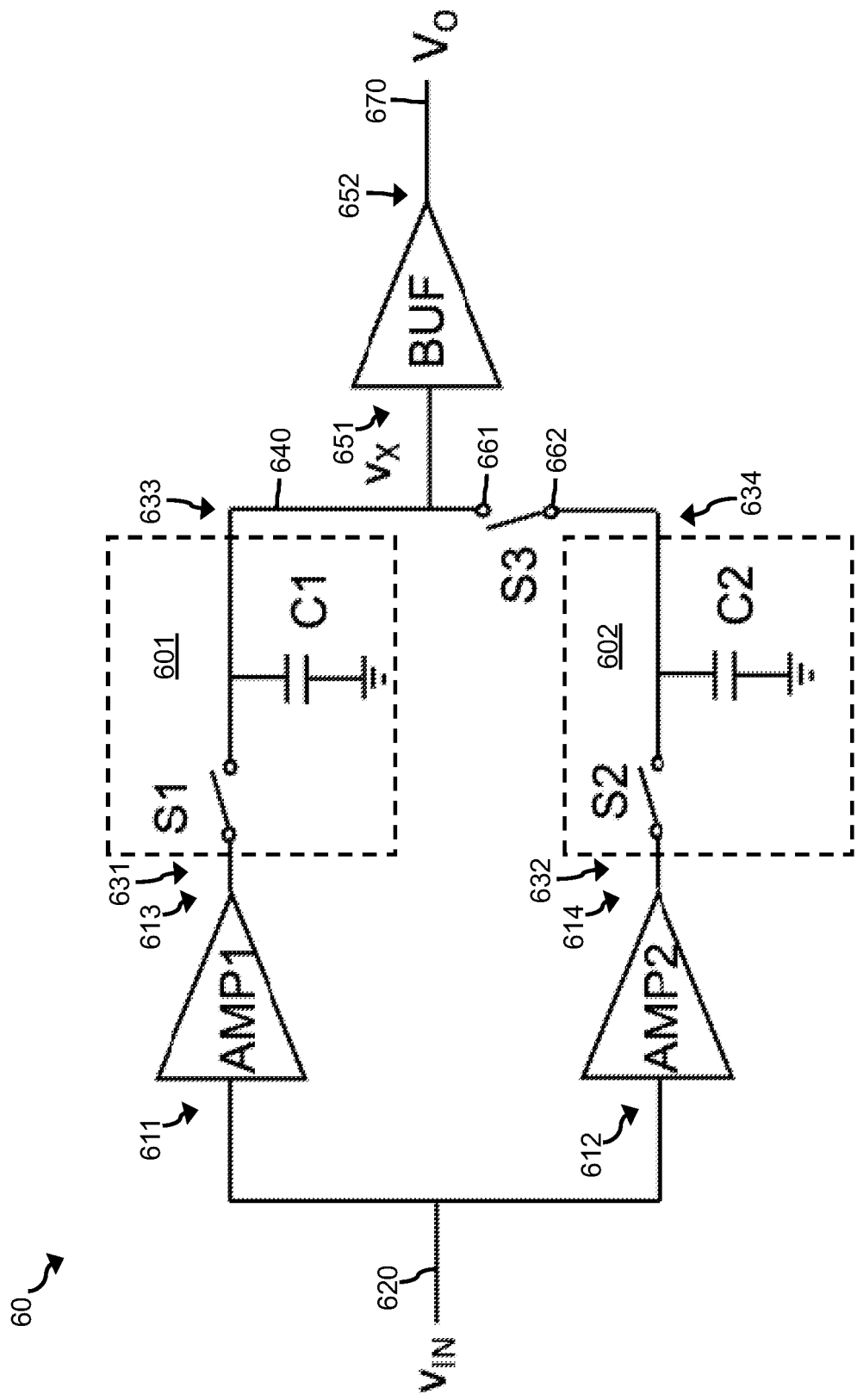
FIG. 6 is a schematic circuit diagram of a multipath sampling circuit according to a second embodiment of the invention.

FIG. 6 is a schematic circuit diagram of a multipath sampling circuit 60 according to a second embodiment of the invention. The multipath sampling circuit 60 comprises a first voltage amplifier AMP1, a second voltage amplifier AMP2, a first track-and-hold circuit 601, a second track-and-hold circuit 602, a shorting switch S3, and a buffer amplifier BUF. The first voltage amplifier AMP1 and the first track-and-hold circuit 601 are electrically coupled in parallel with the second voltage amplifier AMP2 and the second track-and-hold circuit 602. The first and second voltage amplifiers AMP1, AMP2 have respective inputs 611, 612 that are electrically coupled in series to an input line 620 that has an input voltage $V_{IN}$.

The inputs 631, 632 of the first and second track-and-hold circuits 601, 602 are electrically coupled to the outputs 613, 614 of the first and second voltage amplifiers AMP1, AMP2. The first and second track-and-hold circuits 601, 602 have a first state in which the outputs 613, 614 of the first and second voltage amplifiers AMP1, AMP2 are electrically coupled to a shorting line 640, which is electrically coupled to an input 651 of the buffer amplifier BUF. The shorting line 640 has a voltage $V_x$. The first and second track-and-hold circuits 601, 602 have a second state in which the outputs 613, 614 of the first and second voltage amplifiers AMP1, AMP2 are electrically decoupled from the shorting line 640.

The shorting switch S3 has a first terminal 661 that is electrically coupled to an output 633 of the first track-and-hold circuit 601 and a second terminal 662 that is electrically coupled to an output 634 of the second track-and-hold circuit 602. An output 652 of the buffer amplifier BUF is electrically coupled to an output line 670 that has an output voltage $V_o$.

Thus, the circuit 60 includes a plurality of voltage amplifiers and track-and-hold circuits that are electrically coupled in parallel with one another. In FIG. 6, there are 2 voltage amplifiers and 2 track-and-hold circuits. In other embodiments, there can be more 3, 4, 5, or another number (e.g., a positive integer greater than or equal to 2) of voltage amplifiers and track-and-hold circuits that are electrically coupled in parallel with one another. The output of each set or row of voltage amplifiers and track-and-hold circuits is electrically coupled to the shorting line 640 as illustrated in FIG. 6. The input of each set or row of voltage amplifiers and track-and-hold circuits is electrically coupled to the input line 620.

In one example, the first track-and-hold circuit 601 includes a first sampling switch S1 and a first sampling capacitor C1 and the second track-and-hold circuit 602 includes a second sampling switch S2 and a second sampling capacitor C2. The first sampling capacitor C1 has a capacitance of $C_1$, and the second sampling capacitor C2 has a capacitance of $C_2$. A first terminal of each sampling capacitor C1, C2 is electrically coupled to the shorting line 640. A second terminal of each sampling capacitor C1, C2 is electrically coupled to the ground. Switches S1, S2, and S3 can be single-pole single-throw (SPST) switches. The first and second track and hold circuits 301, 302 in FIG. 3 can be the same as the first and second track and hold circuits 601, 602, respectively.

As in multipath sampling circuit 30, the output voltage $V_{o1}$ (e.g., at output 613) of the first voltage amplifier AMP1 can be characterized as follows:

$$v_{o1}=a_1 v_{IN}, v_{IN} < V_1 \tag{9}$$

$$v_{o1}=a_1 V_1, v_{IN} \geq V_1 \tag{10}$$

where $V_1$ is the saturation voltage of the first voltage amplifier AMP1 and $a_1$ is the gain of the first voltage amplifier AMP1. In other words, the first voltage amplifier AMP1 has a linear input range below $V_1$.

In addition the output voltage $V_{o2}$ (e.g., at output 614) of the second voltage amplifier AMP2 can be characterized as follows:

$$v_{o2}=a_2 v_{IN}, v_{IN} < V_2 \tag{11}$$

$$v_{o2}=a_2 V_2, v_{IN} \geq V_2 \tag{12}$$

where $V_2$ is the saturation voltage of the second voltage amplifier AMP2 and $a_2$ is the gain of the second voltage amplifier AMP2. In other words, the second voltage amplifier AMP2 has a linear input range below $V_2$.

As can be seen, $V_2$ is different (e.g., greater) from $V_1$. In some embodiments, $V_2$ can be at least twice (e.g., 2-10×) $V_1$. In addition, $a_2$ is different (e.g., less) than $a_1$. In some embodiments, $a_2$ can be less than or equal to half (e.g., 0.1-0.5×) $a_1$.

Figure 7:
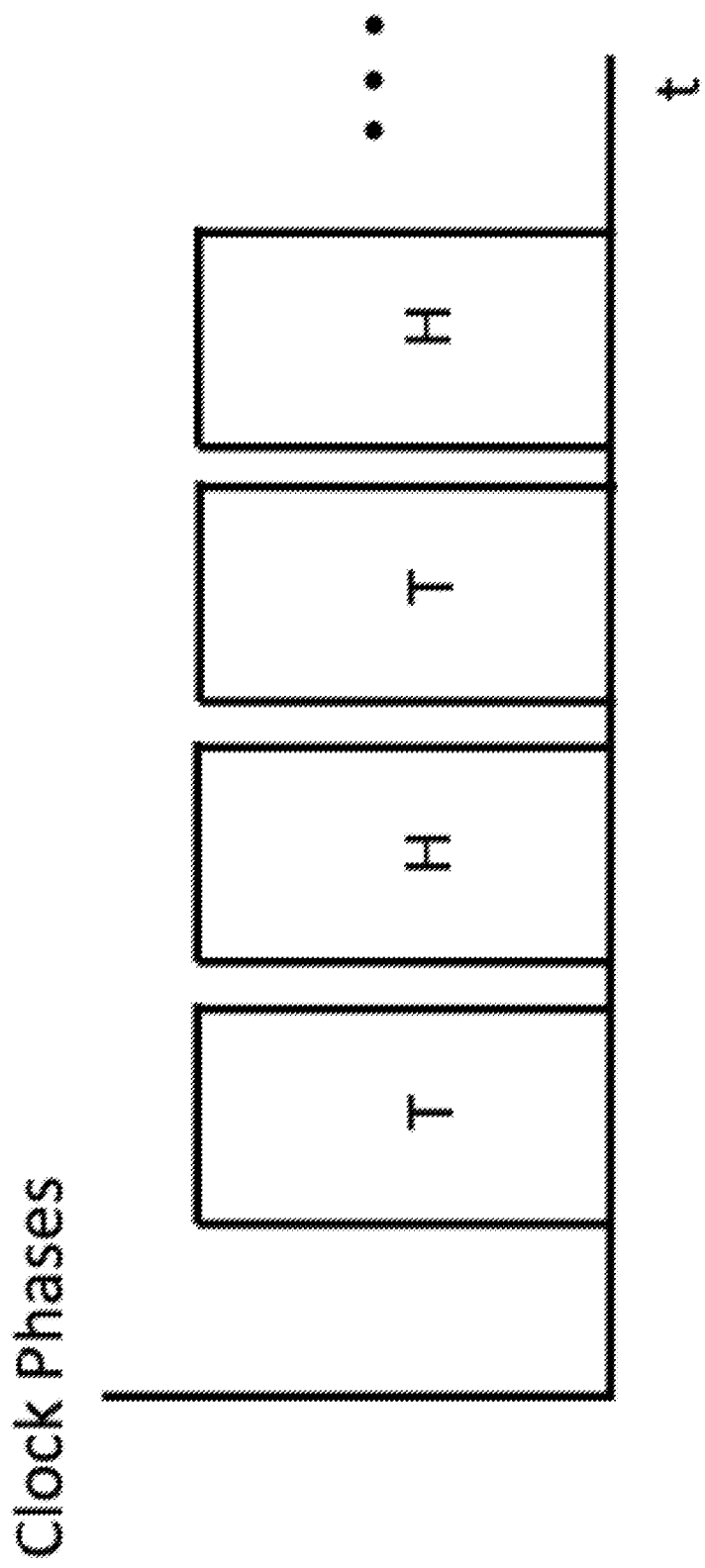
FIG. 7 is a graph of the clock phases of the multipath sampling circuit illustrated in FIG. 6 according to an embodiment.

The circuit 60 operates in two clock phases as shown in FIG. 7, a tracking phase (T) and a hold phase (H). During the tracking phase, the first and second track-and-hold circuits 601, 602 are in the first state (e.g., sampling switches S1 and S2 are in a closed state) and the shorting switch s3 is in an open state. At the end of the tracking phase, the first and second track-and-hold circuits 601, 602 transition to the second state (e.g., sampling switches S1 and S2 transition to the open state), then (e.g., after 1-3 gate delays) the shorting switch S3 transitions to a closed state.

During the hold phase, the voltage $v_x$ at the shorting line 640 and the input 651 of the buffer amplifier BUF, and the output voltage $v_o$ at the output 652 of the buffer amplifier BUF are equal and can be shown to be:

$$v_O = v_X = \frac{(C_1 v_{O1} + C_2 v_{O2})}{C_1 + C_2} = \frac{(C_1 a_1 + C_2 a_2)}{C_1 + C_2} v_{IN}, \quad v_{IN} < V_1 \tag{13}$$

$$v_O = v_X = \frac{(C_1 a_1 V_1 + C_2 a_2 v_{IN})}{C_1 + C_2}, \quad V_1 \leq v_{IN} \leq V_2 \tag{14}$$

$$v_O = v_X = \frac{(C_1 a_1 V_1 + C_2 a_2 V_2)}{C_1 + C_2}, \quad v_{IN} > V_2 \tag{15}$$

Figure 8:
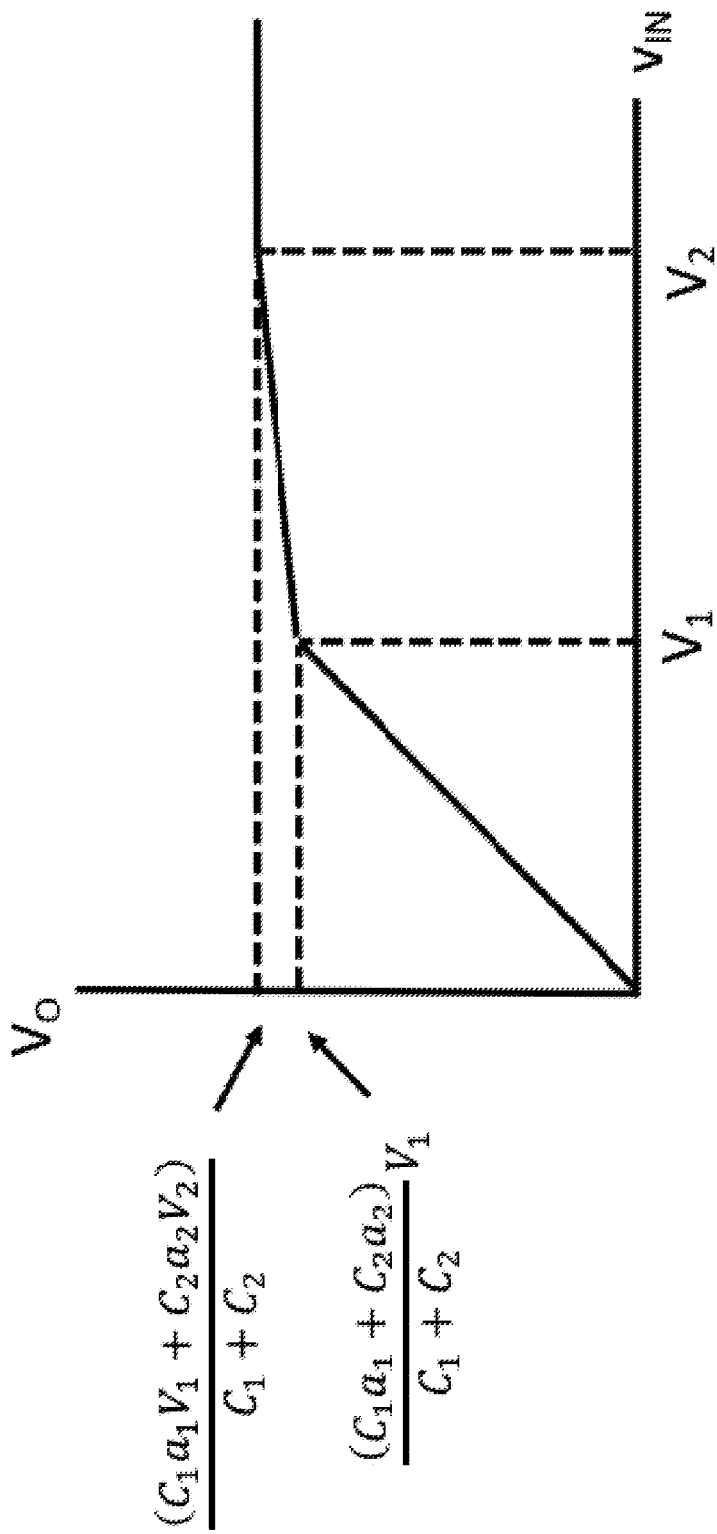
FIG. 8 is a graph of the output voltage of the multipath sampling circuit illustrated in FIG. 6 according to an embodiment.

These characteristics are graphically illustrated in FIG. 8. The output voltage increases linearly for the input voltage less than $V_1$ at a gain of $$\frac{(C_1 a_1 + C_2 a_2)}{C_1 + C_2},$$

keeps increasing once the input voltage exceeds $V_1$ at a lower incremental gain of $$\frac{C_2 a_2}{C_1 + C_2}.$$

For the input voltage greater than $V_2$, the output saturates at $$\frac{(C_1 a_1 V_1 + C_2 a_2 V_2)}{C_1 + C_2}$$

By properly choosing the values of $a_1$, $a_2$, $C_1$ and $C_2$, different breakpoints and incremental gains can be realized. Also, by employing additional sets or rows of voltage amplifiers and track-and-hold circuits that are electrically coupled in parallel with one another, multiple sections of different gain regions may be realized. One of the benefits of the present invention is that the output of the sampling circuit 60 does not saturate at $V_1$ and provides a wider dynamic range than a conventional sampling circuit. In addition, since the gain is not reduced for the input signal $V_{IN}$ lower than $V_1$, noise performance is not compromised. Since the incremental gain is lower for input signals $V_{IN}$ greater than $V_1$, noise in the circuits following the sampling circuit 60 is increased when referred to the input $V_{IN}$ of the sampling circuit. However, since the input signal $V_{IN}$ is already large (e.g., greater than $V_1$) in this case, it does not pose a problem in most systems.

Figure 9:
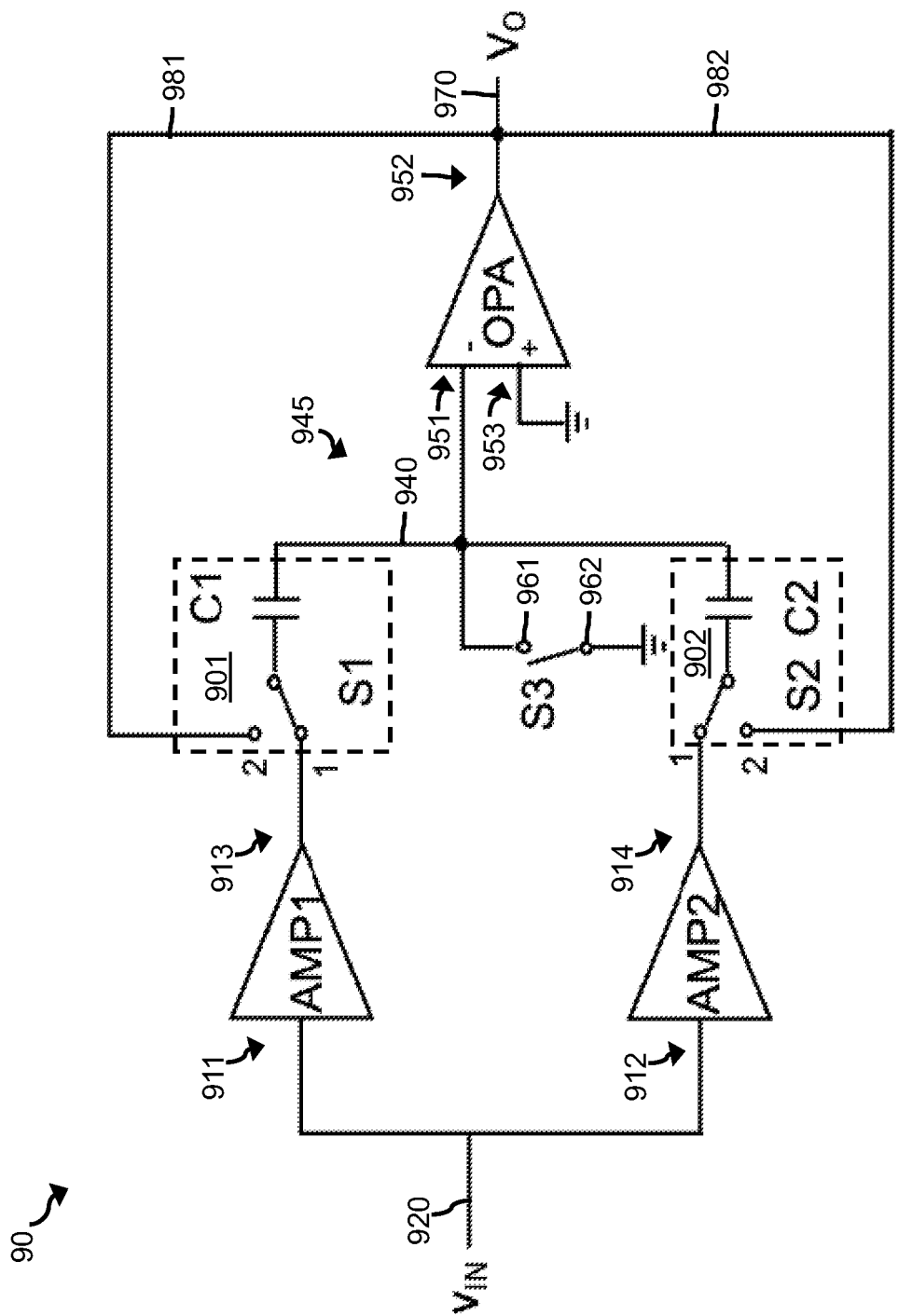
FIG. 9 is a schematic circuit diagram of a multipath sampling circuit according to a third embodiment of the invention.

FIG. 9 is a schematic circuit diagram of a multipath sampling circuit 90 according to a third embodiment of the invention. The multipath sampling circuit 90 comprises a first voltage amplifier AMP1, a second voltage amplifier AMP2, a first track-and-hold circuit 901, a second track-and-hold circuit 902, a sampling switch S3, and an operational amplifier OPA.

The first and second voltage amplifiers AMP1, AMP2 are electrically coupled in parallel with each other. The first and second voltage amplifiers AMP1, AMP2 have respective inputs 911, 912 that are electrically coupled in series to an input line 920 that has an input voltage $V_{IN}$. AMP1 and AMP2 can be characterized by Equations (2)-(5).

The first and second track-and-hold circuits 901, 902 have a first state in which the outputs 913, 914 of the first and second voltage amplifiers AMP1, AMP2 are electrically coupled to a sampling circuit 945 that includes the sampling switch S3 and a shorting line 940. In the first state, the first voltage amplifier AMP1 and the first track-and-hold circuit 901 are electrically coupled in parallel with the second voltage amplifier AMP2 and the second track-and-hold circuit 902. The first and second track-and-hold circuits 901, 902 have a second state in which the outputs 913, 914 of the first and second voltage amplifiers AMP1, AMP2 are electrically coupled to first and second feedback lines 981, 982, respectively, that are electrically coupled to an output 752 of the operational amplifier OPA. An output line 970 is electrically coupled to the output 752 of the operational amplifier OPA. The output 952 and the output line 970 have an output voltage $V_o$.

The shorting line 940 is electrically coupled to the sampling switch S3 and to an input of the operational amplifier OPA. For example, the shorting line 940 is electrically coupled to an inverting side 951 of a differential input of the operational amplifier OPA. A non-inverting side 953 of the differential input of the operational amplifier OPA can be electrically coupled to ground.

The sampling switch S3 is electrically coupled to the shorting line 940. The sampling switch S3 has a first terminal 961 that is electrically coupled to the shorting line 940 and a second terminal 962 that is electrically coupled to ground. The sampling switch S3 has an open state and a closed state. The sampling switch S3 can be a SPST switch.

Thus, the circuit 90 includes a plurality of voltage amplifiers and track-and-hold circuits that are electrically coupled in parallel with one another. Each track-and-hold circuit has a first state in which the output of the respective voltage amplifier is electrically coupled to a shorting line. Each track-and-hold circuit has a second state in which the output of the respective voltage amplifier is electrically coupled to a respective feedback line that is electrically coupled to an output of the operational amplifier OPA. In FIG. 9, there are 2 voltage amplifiers and 2 track-and-hold circuits. In other embodiments, there can be more 3, 4, 5, or another number (e.g., a positive integer greater than or equal to 2) of voltage amplifiers and track-and-hold circuits that are electrically coupled in parallel with one another and that have first and second states as described above. The input of each set or row of voltage amplifiers and track-and-hold circuits is electrically coupled to the input line 920.

In one example, the first track-and-hold circuit 901 includes a first tracking switch S1 and a first sampling capacitor C1 and the second track-and-hold circuit 902 includes a second tracking switch S2 and a second sampling capacitor C2. The first sampling capacitor C1 has a capacitance of $C_1$, and the second sampling capacitor C2 has a capacitance of $C_2$. A first terminal of each sampling capacitor C1, C2 is electrically coupled to the shorting line 940. A second terminal of each sampling capacitor C1, C2 is electrically coupled to the respective tracking switch S1, S2. When the tracking switches S1, S2 are in a first state (e.g., thrown to position 1), the second terminal of each sampling capacitor C1, C2 is electrically coupled to the respective output 913, 914 of the first and second voltage amplifiers AMP1, AMP2. When the tracking switches S1, S2 are in a second state (e.g., thrown to position 2), the second terminal of each sampling capacitor C1, C2 is electrically coupled to the respective feedback line 981, 982. The tracking switches S1, S2 can be single-pole double-throw (SPDT) switches.

The circuit 90 operates in two phases as shown in FIG. 7, a tracking phase (T) and a hold phase (H). During the tracking phase, the first and second track-and-hold circuits 901, 902 are in the first state (e.g., tracking switches S1 and S2 are thrown to position 1) and the sampling switch S3 is in a closed state. At the end of the tracking phase, the sampling switch S3 transitions to the open state, then (e.g., after 1-3 gate delays), the first and second track-and-hold circuits 901, 902 transition to the second state (e.g., tracking switches S1 and S2 are thrown to position 2) in the hold phase.

Figure 10:
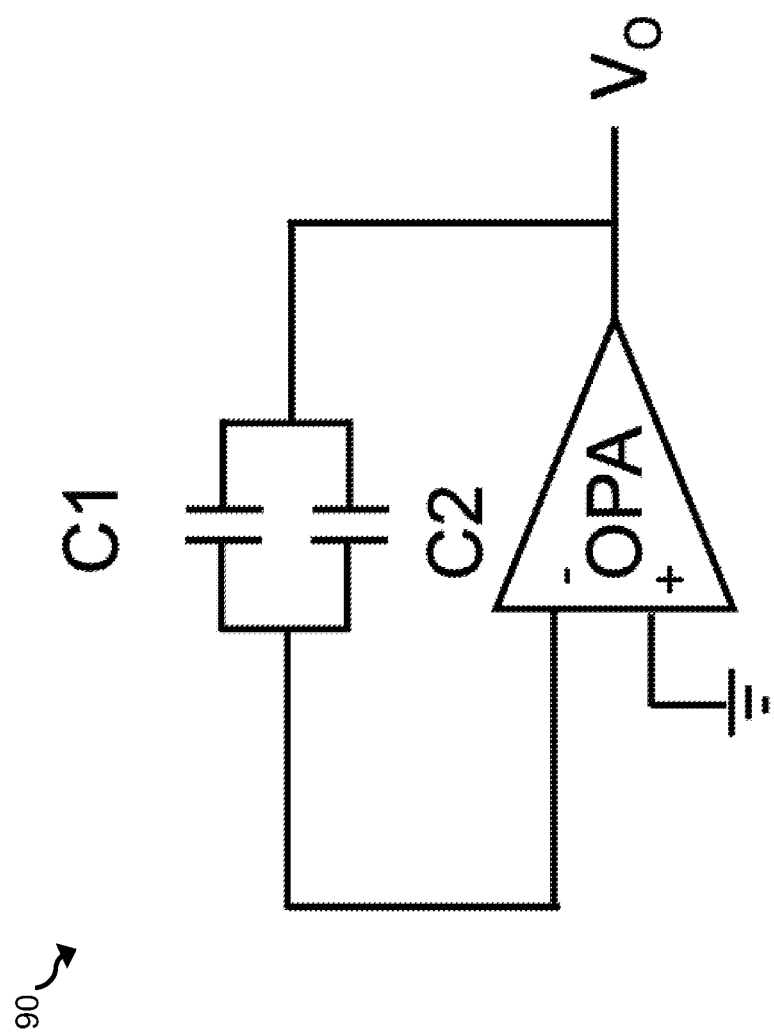
FIG. 10 is a schematic circuit diagram of the multipath sampling circuit illustrated in FIG. 9 to show the electrical connection during the hold phase.

FIG. 10 is a schematic circuit diagram of the multipath sampling circuit 90 to show the electrical connection during the hold phase. The switches S1-S3 are omitted in FIG. 10 for clarity.

Assuming that the OPA is an ideal operational amplifier, it can be shown that the output voltage $V_o$ at the output 952 of the operational amplifier OPA during the hold phase is identical to that of multipath sampling circuit 60 (e.g., the second embodiment), and is characterized by Equations (13)-(15) and as illustrated in FIG. 8.

As with multipath sampling circuit 60, by properly choosing the values of $a_1$, $a_2$, $C_1$ and $C_2$, different breakpoints and incremental gains can be realized for multipath sampling circuit 90. Also, by employing additional sets or rows of voltage amplifiers and track-and-hold circuits that are electrically coupled in parallel with one another, multiple sections of different gain regions may be realized.

Figure 11:
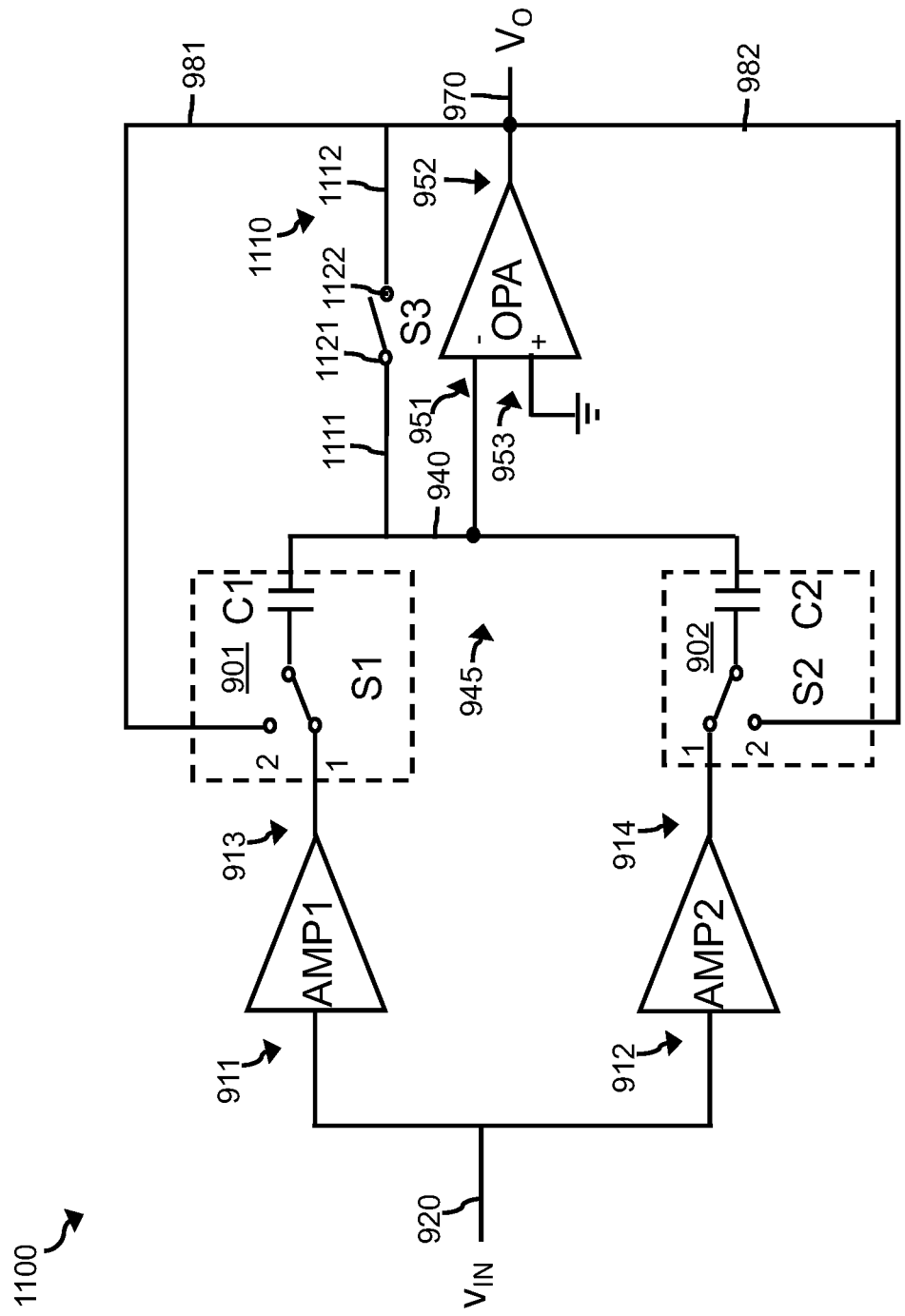
FIG. 11 is a schematic circuit diagram of a multipath sampling circuit according to a fourth embodiment of the invention.

FIG. 11 is a schematic circuit diagram of a multipath sampling circuit 1100 according to a fourth embodiment of the invention. Multipath sampling circuit 1100 is the same as multipath sampling circuit 90 except for the position and connection of sampling switch S3. In multipath sampling circuit 1100, sampling switch S3 is electrically coupled to a second shorting line 1110. A first terminal 1121 of the sampling switch is electrically coupled to a first side 1111 of the second shorting line 1110. A second terminal 1122 of the sampling switch is electrically coupled to a second side 1112 of the second shorting line 1110. The sampling switch S3 has a closed state in which the first and second sides 1111, 1112 of the second shorting line 1110 are electrically coupled, and an open state in which the first and second sides 1111, 1112 of the second shorting line 1110 are electrically decoupled.

The circuit 1100 operates in two phases as shown in FIG. 7, a tracking phase (T) and a hold phase (H). During the tracking phase, the first and second track-and-hold circuits 901, 902 are in the first state (e.g., tracking switches S1 and S2 are thrown to position 1) and the sampling switch S3 is in a closed state. At the end of the tracking phase, the sampling switch S3 transitions to the open state, then (e.g., after 1-3 gate delays), the first and second track-and-hold circuits 901, 902 transition to the second state (e.g., tracking switches S1 and S2 are thrown to position 2) in the hold phase.

During the tracking phase, the sampling switch S3 is closed to electrically connect the first and second sides 1111, 1112 of the second shorting line 1110. When the first and second sides 1111, 1112 of the second shorting line 1110 are electrically connected, the first feedback line 981 is electrically coupled to the first shorting line 940, which thus electrically connects the inverting input 951 and the output 952 of the OPA, thereby forcing the inverting input voltage to the offset voltage of OPA. This samples the offset voltage of the OPA on the right plates of C1 and C2, cancelling the effect of the offset voltage of OPA. At the end of the tracking phase, S3 is opened first, then the tracking switches S1 and S2 are thrown to position 2. The electrical connection during the hold phase is identical to that of the third embodiment shown in FIG. 10 with switches omitted for clarity.

During the hold phase, the sampling switch S3 is open to electrically decouple the first and second sides 1111, 1112 of the second shorting line 1110. When the first and second sides 1111, 1112 of the second shorting line 1110 are electrically decoupled, the first feedback line 981 is electrically decoupled from the first shorting line 940.

It can be shown that the output voltage $V_o$ at the output of the OPA during the hold phase is identical to that of the multipath sampling circuit 60 (e.g., the second embodiment) even with a nonzero offset voltage of OPA, and is given by Equations (13)-(15) and FIG. 8.

As with the multipath sampling circuit 60, by properly choosing the values of $a_1$, $a_2$, $C_1$ and $C_2$ in multipath sampling circuit 1100, different breakpoints and incremental gains can be realized. Also, by employing additional sets or rows of voltage amplifiers and track-and-hold circuits that are electrically coupled in parallel with one another, multiple sections of different gain regions may be realized.

Figure 12:
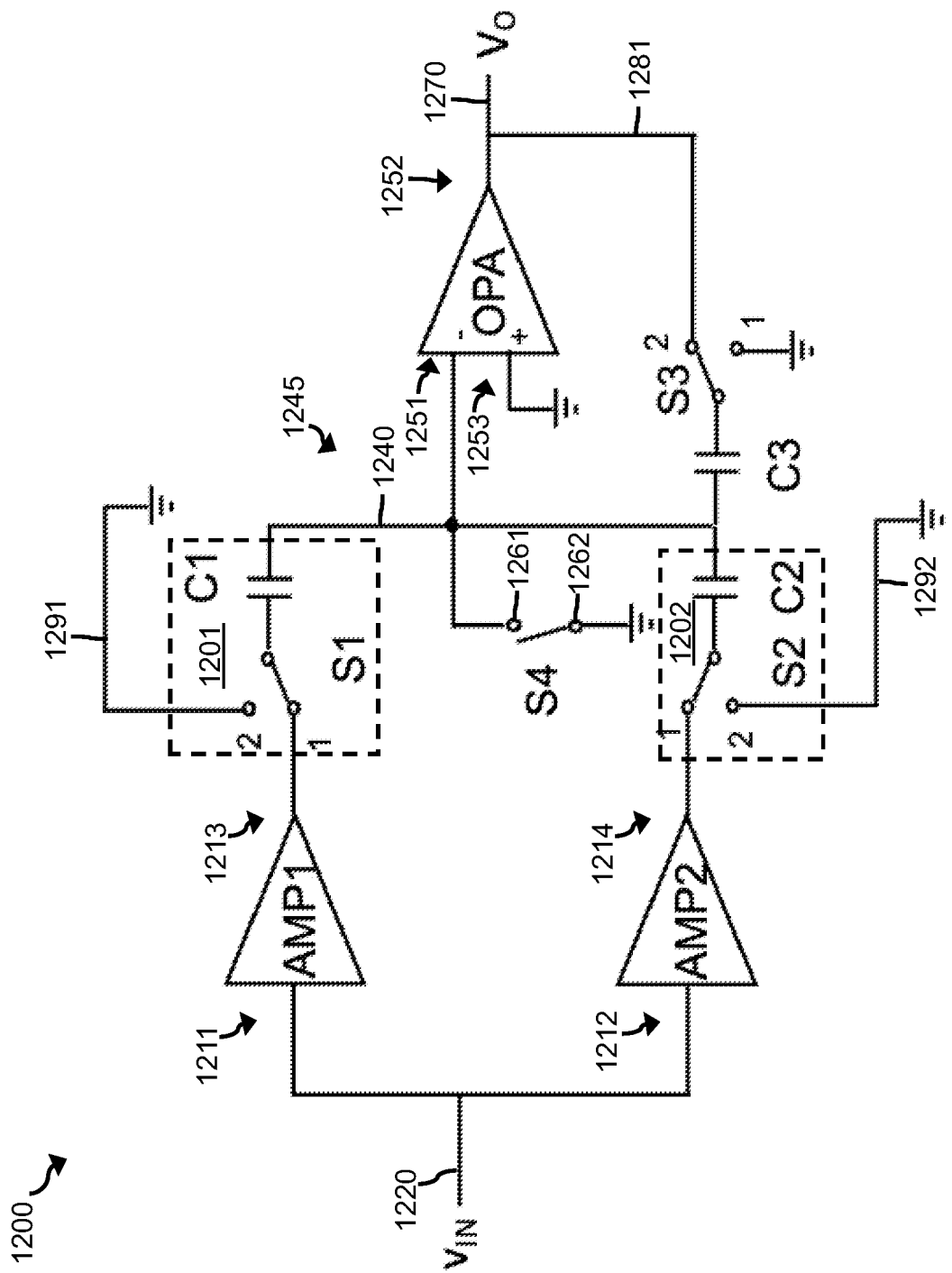
FIG. 12 is a schematic circuit diagram of a multipath sampling circuit according to a fifth embodiment of the invention.

FIG. 12 is a schematic circuit diagram of a multipath sampling circuit 1200 according to a fifth embodiment of the invention. The multipath sampling circuit 1200 comprises a first voltage amplifier AMP1, a second voltage amplifier AMP2, a first track-and-hold circuit 1201, a second track-and-hold circuit 1202, a feedback capacitor C3, a grounding switch S3, a sampling switch S4, and an operational amplifier OPA. The first and second voltage amplifiers AMP1, AMP2 are electrically coupled in parallel with each other. The first and second voltage amplifiers AMP1, AMP2 have respective inputs 1211, 1212 that are electrically coupled in series to an input line 1220 that has an input voltage $V_{IN}$. The first and second track-and-hold circuits 1201, 1202 can be the same as the first and second track-and-hold circuits 901, 902 and/or the first and second track-and-hold circuits 1201, 1202, respectively. AMP1 and AMP2 can be characterized by Equations (2)-(5).

The first and second track-and-hold circuits 1201, 1202 have a first state in which the outputs 1213, 1214 of the first and second voltage amplifiers AMP1, AMP2 are electrically coupled to a sampling circuit 1245 that includes the sampling switch S4 and a shorting line 1240. In the first state, the first voltage amplifier AMP1 and the first track-and-hold circuit 1201 are electrically coupled in parallel with the second voltage amplifier AMP2 and the second track-and-hold circuit 1202. The first and second track-and-hold circuits 1201, 1202 have a second state in which the first and second track-and-hold circuits 1201, 1202 are electrically coupled to ground (e.g., via ground lines 1291, 1292, respectively).

The shorting line 1240 is electrically coupled to the sampling switch S4 and to an input of the operational amplifier OPA. For example, the shorting line 1240 is electrically coupled to an inverting side 1251 of a differential input of the operational amplifier OPA. A non-inverting side 1253 of the differential input of the operational amplifier OPA can be electrically coupled to ground. An output line 1270 is electrically coupled to an output 1252 of the operational amplifier OPA. The output 1252 and the output line 1270 have an output voltage $V_o$.

The sampling switch S4 is electrically coupled to the shorting line 1240. The sampling switch S4 has a first terminal 1261 that is electrically coupled to the shorting line 1240 and a second terminal 1262 that is electrically coupled to ground. The sampling switch S4 has an open state and a closed state. The sampling switch S4 can be a SPST switch.

A feedback line 1281 is electrically coupled to the output 1252 of the operational amplifier OPA and to the shorting line 1240. The feedback capacitor C3 and grounding switch S3 are electrically coupled to the feedback line 1281. The grounding switch S3 has a first state and a second state. In the first state, the grounding switch S3 is thrown to position 1 such that the grounding switch is electrically coupled to ground which causes the output line 1270 of the operational amplifier OPA to be electrically coupled to ground. In the second state, the grounding switch S3 is thrown to position 2 such that the grounding switch is electrically coupled to a first terminal of the feedback capacitor C3. A second terminal of the feedback capacitor C3 is electrically coupled to the shorting line 1240. Thus, when the grounding switch S3 is thrown to position 2, a feedback circuit to the operational amplifier OPA is completed.

Thus, the circuit 1200 includes a plurality of voltage amplifiers and track-and-hold circuits that are electrically coupled in parallel with one another. Each track-and-hold circuit has a first state in which the output of the respective voltage amplifier is electrically coupled to shorting line 1240. Each track-and-hold circuit has a second state in which the output of the respective voltage amplifier is electrically coupled to ground (e.g., via a respective ground line). In FIG. 12, there are 2 voltage amplifiers and 2 track-and-hold circuits. In other embodiments, there can be more 3, 4, 5, or another number (e.g., a positive integer greater than or equal to 2) of voltage amplifiers and track-and-hold circuits that are electrically coupled in parallel with one another and that have first and second states as described above. The input of each set or row of voltage amplifiers and track-and-hold circuits is electrically coupled to the input line 1220.

In one example, the first track-and-hold circuit 1201 includes a first tracking switch S1 and a first sampling capacitor C1 and the second track-and-hold circuit 1202 includes a second tracking switch S2 and a second sampling capacitor C2. The first sampling capacitor C1 has a capacitance of $C_1$, and the second sampling capacitor C2 has a capacitance of $C_2$. A first terminal of each sampling capacitor C1, C2 is electrically coupled to the shorting line 1240. A second terminal of each sampling capacitor C1, C2 is electrically coupled to the respective tracking switch S1, S2. When the track-and-hold circuits 1201, 1202 are in the first state, the tracking switches S1, S2 are in a first state (e.g., thrown to position 1) in which the second terminal of each sampling capacitor C1, C2 is electrically coupled to the respective output 1213, 1214 of the first and second voltage amplifiers AMP1, AMP2. When the track-and-hold circuits 1201, 1202 are in the second state, the tracking switches S1, S2 are in a second state (e.g., thrown to position 2) in which the second terminal of each sampling capacitor C1, C2 is electrically coupled to ground (e.g., via ground lines 1291, 1292, respectively). The tracking switches S1, S2 and the grounding switch S3 can be SPDT switches.

Figure 13:
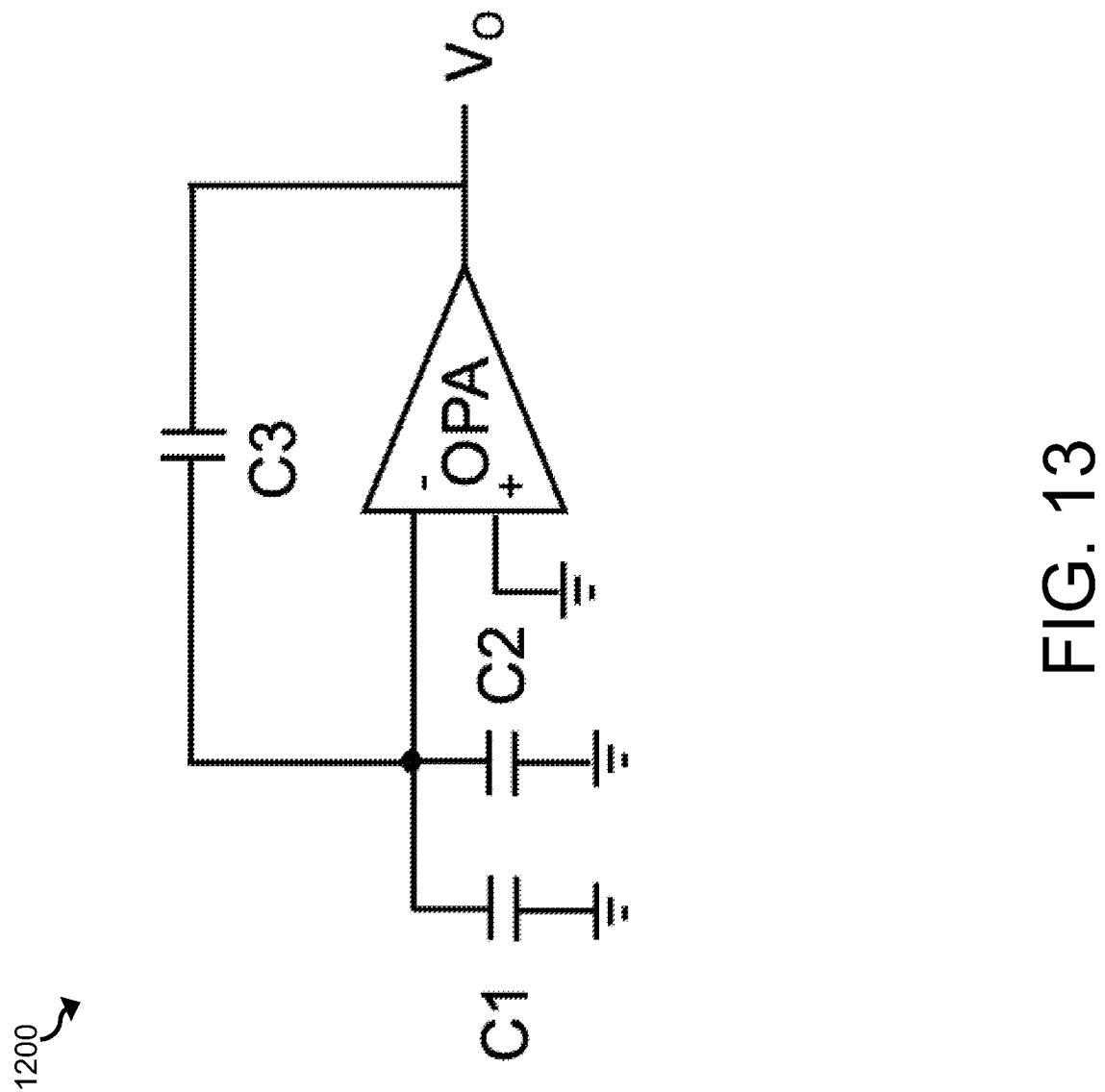
FIG. 13 is a schematic circuit diagram of the multipath sampling circuit illustrated in FIG. 12 to show the electrical connection during the hold phase.

The circuit 1200 operates in two phases as shown in FIG. 7, a tracking phase (T) and a hold phase (H). During the tracking phase, the first and second track-and-hold circuits 1201, 1202 are in the first state (e.g., tracking switches S1 and S2 are thrown to position 1), the grounding switch S3 is in the first state (e.g., thrown to position 1), and the sampling switch S4 is in the closed state. At the end of the tracking phase, the sampling switch s4 transitions to the open state, then (e.g., after 1-3 gate delays), the first and second track-and-hold circuits 1201, 1202 transition to the second state (e.g., tracking switches S1 and S2 are thrown to position 2) and the grounding switch S3 is in the second state (e.g., thrown to position 2) in the hold phase. FIG. 13 is a schematic circuit diagram of the multipath sampling circuit 1200 to show the electrical connection during the hold phase. The switches S1-S4 are omitted in FIG. 13 for clarity.

The output voltage $V_o$ at the output 1252 of the operational amplifier OPA can be shown to be:

$$v_O = v_X = \frac{(C_1 v_{O1} + C_2 v_{O2})}{C_3} = \frac{(C_1 a_1 + C_2 a_2)}{C_3} v_{IN}, \quad v_{IN} < V_1 \quad (16)$$

$$v_O = v_X = \frac{(C_1 a_1 V_1 + C_2 a_2 v_{IN})}{C_3}, \quad V_1 \le v_{IN} \le V_2 \quad (17)$$

$$v_O = v_X = \frac{(C_1 a_1 V_1 + C_2 a_2 V_2)}{C_3}, \quad v_{IN} > V_2 \quad (18)$$

Figure 14:
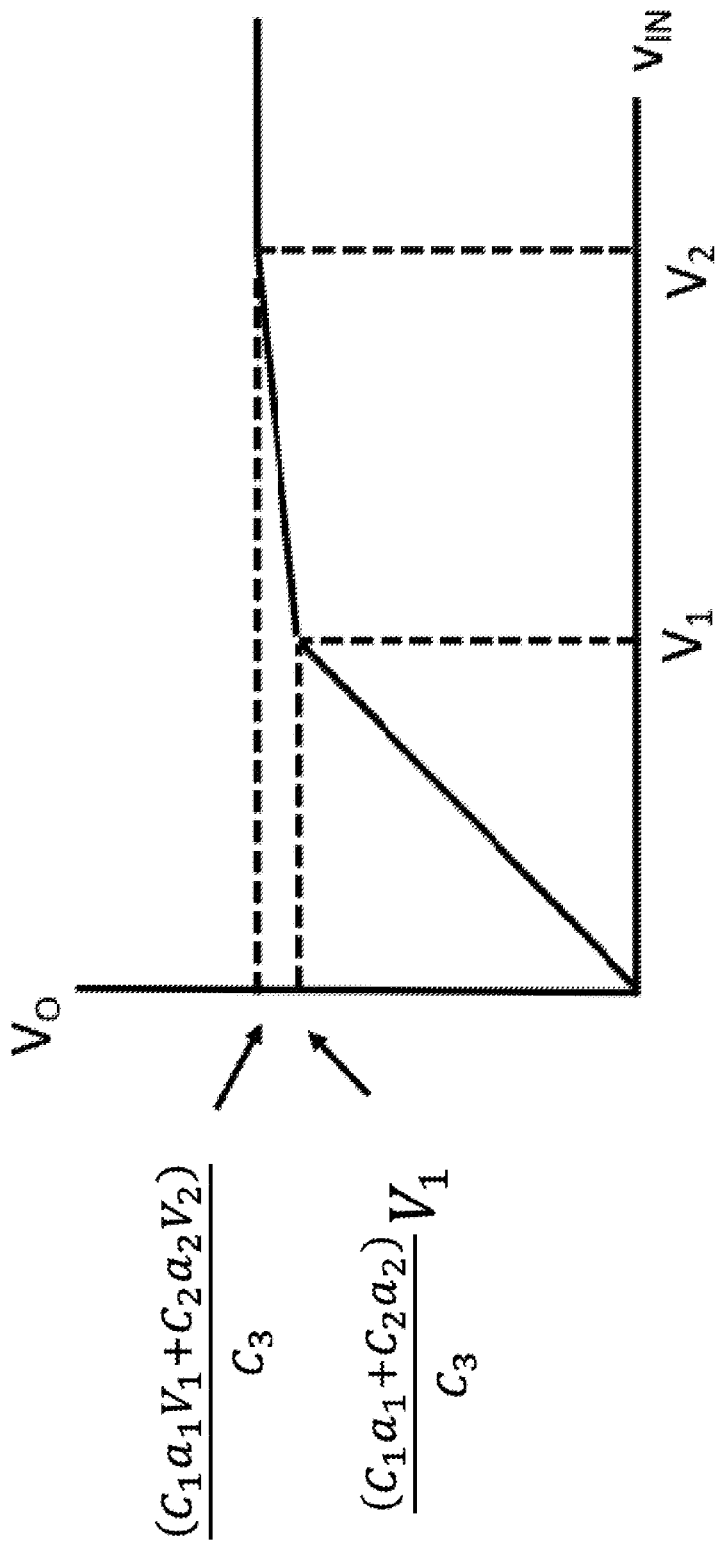
FIG. 14 is a graph of the output voltage of the multipath sampling circuit illustrated in FIG. 12 according to an embodiment.

These characteristics are graphically illustrated in FIG. 14, which is similar to the graph illustrated in FIG. 8 for multipath sampling circuits 60 and 90 except the gains are scaled by a factor of $$\frac{C_1 + C_2}{C_3}.$$

The output voltage decreases linearly for the input voltage less than $V_1$ at a gain of $$\frac{(C_1 a_1 + C_2 a_2)}{C_3},$$

keeps decreasing when the input voltage exceeds $V_1$ at a lower incremental gain of $$\frac{(C_1 a_1 V_1 + C_2 a_2 V_2)}{C_3}.$$

For the input voltage greater than $V_2$, the output saturates at $$\frac{C_2 a_2}{C_3}.$$

By properly choosing the values of $a_1$, $a_2$, $C_1$, $C_2$, and $C_3$, different breakpoints and incremental gains can be realized for multipath sampling circuit 1200. Also, by employing additional sets or rows of voltage amplifiers and track-and-hold circuits that are electrically coupled in parallel with one another, multiple sections of different gain regions may be realized.

Figure 15:
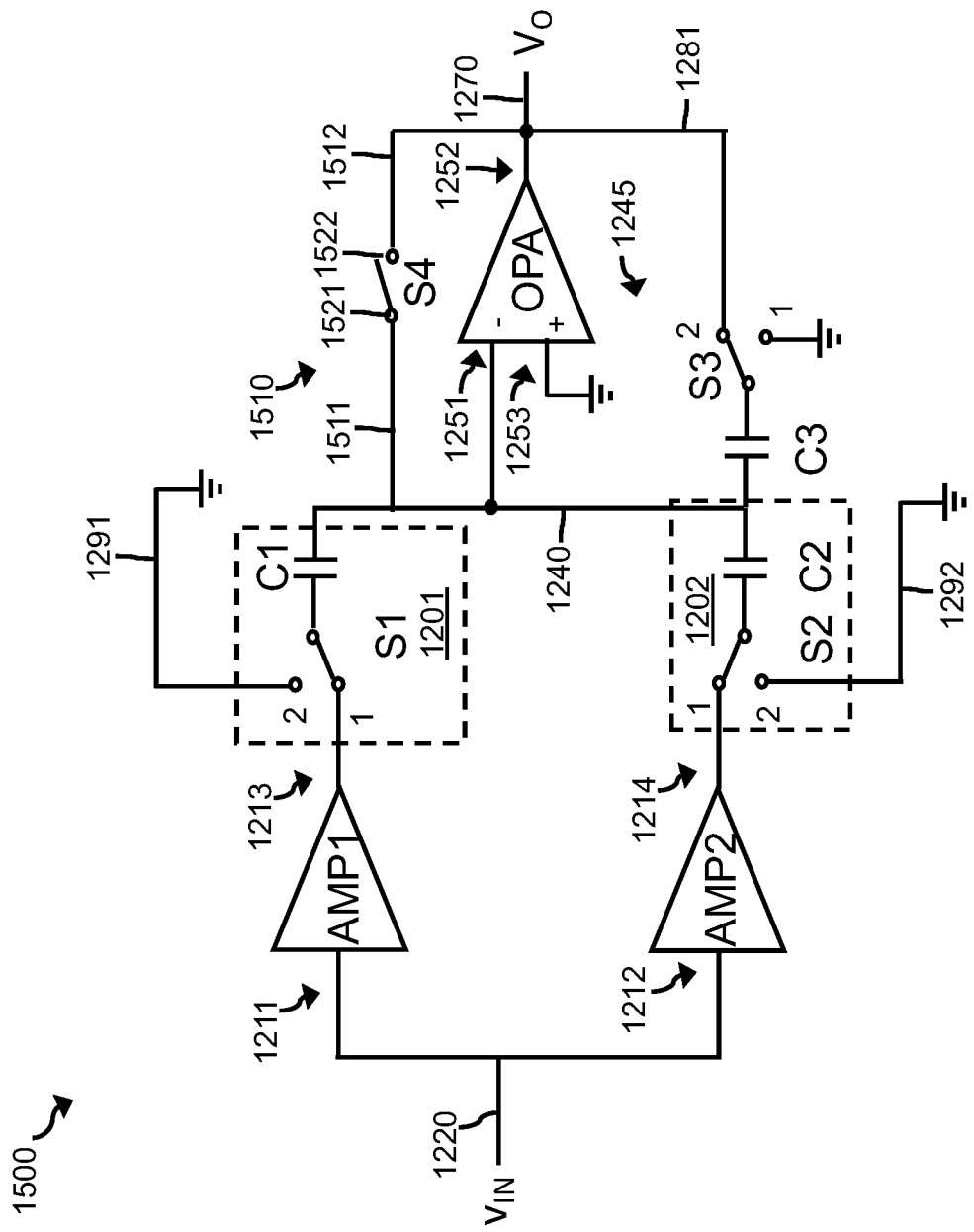
FIG. 15 is a schematic circuit diagram of a multipath sampling circuit according to a sixth embodiment of the invention.

FIG. 15 is a schematic circuit diagram of a multipath sampling circuit 1500 according to a sixth embodiment of the invention. Multipath sampling circuit 1500 is the same as multipath sampling circuit 1200 except for the position and connection of sampling switch S4. In multipath sampling circuit 1500, the sampling switch S4 is electrically coupled to a second feedback line 1510. A first terminal 1521 of the sampling switch S4 is electrically coupled to a first side 1511 of the second feedback line 1510. A second terminal 1522 of the sampling switch S4 is electrically coupled to a second side 1512 of the second feedback line 1510. The sampling switch S4 has a closed state in which the first and second sides 1511, 1512 of the second feedback line 1510 are electrically coupled, and an open state in which the first and second sides 1511, 1512 of the second feedback line 1510 are electrically decoupled.

The multipath sampling circuit 1500 operates in two phases as shown in FIG. 7, a tracking phase (T) and a hold phase (H). During the tracking phase, S1, S2, and S3 are thrown to position 1, S4 is closed. When the first and second sides 1511, 1512 of the second feedback line 1510 are electrically coupled, the shorting line 1240 is electrically coupled to the second feedback line 1512, which electrically connects the inverting input 1251 and the output 1252 of the OPA, thereby forcing the inverting input voltage to the offset voltage of OPA. This samples the offset voltage of the OPA on the right plates of C1 and C2, cancelling the effect of the offset voltage of OPA. At the end of the tracking phase, S3 is opened first, then the tracking switches S1 and S2 are thrown to position 2. To transition to the hold phase, S4 is first opened S1, S2, and S3 are thrown to position 2 and then (e.g., after 1-3 gate delays) S1, S2, and S3 are thrown to position 2. The electrical connection during the hold phase is identical to that of multipath sampling circuit 1200 shown in FIG. 13 with switches omitted for clarity.

The output voltage $V_o$ at the output 1252 of the operational amplifier OPA can be shown to be:

$$v_O = \frac{(C_1 v_{O1} + C_2 v_{O2})}{C_3} = \frac{(C_1 a_1 + C_2 a_2)}{C_3} v_{IN}, \; v_{IN} < V_1 \quad (19)$$

$$v_O = \frac{(C_1 a_1 V_1 + C_2 a_2 V_2)}{C_3}, \; V_1 < v_{IN} < V_2 \quad (20)$$

$$v_O = \frac{(C_1 a_1 V_1 + C_2 a_2 v_{IN})}{C_3}, \; v_{IN} > V_2 \quad (21)$$

which is similar to the graph illustrated in FIG. 8 for multipath sampling circuit 60 (e.g., the second embodiment), except the gains are scaled by a factor of $$\frac{C_1 + C_2}{C_3}.$$

The output voltage increases linearly for the input voltage less than $V_1$ at a gain of $$\frac{(C_1 a_1 + C_2 a_2)}{C_3},$$

keeps increasing once the input voltage exceeds $V_1$ at a lower incremental gain of $$\frac{C_2 a_2}{C_3}.$$

For the input voltage greater than $V_2$, the output saturates at $$\frac{(C_1 a_1 V_1 + C_2 a_2 V_2)}{C_3}.$$

As with the multipath sampling circuit 60, by properly choosing the values of $a_1$, $a_2$, $C_1$ and $C_2$ in multipath sampling circuit 1100, different breakpoints and incremental gains can be realized. Also, by employing additional sets or rows of voltage amplifiers and track-and-hold circuits that are electrically coupled in parallel with one another, multiple sections of different gain regions may be realized.

Figure 16:
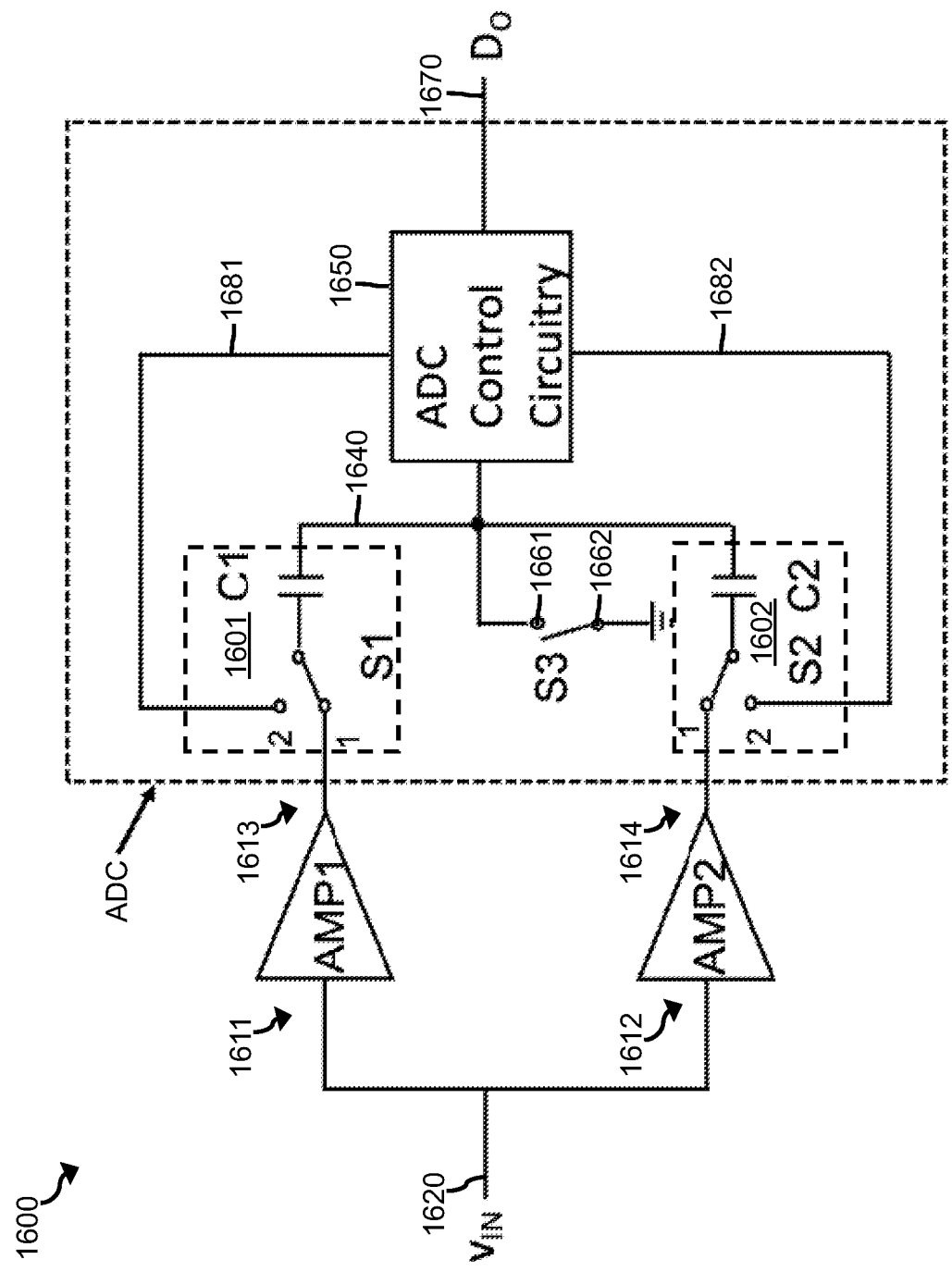
FIG. 16 is a schematic circuit diagram of a multipath sampling circuit according to a seventh embodiment of the invention.

FIG. 16 is a schematic circuit diagram of a multipath sampling circuit 1600 according to a seventh embodiment of the invention. The multipath sampling circuit 1600 comprises a first voltage amplifier AMP1, a second voltage amplifier AMP2, and an analog-to-digital converter ADC. The ADC includes a first track-and-hold circuit 1601, a second track-and-hold circuit 1602, and ADC control circuitry 1650.

It comprises a first amplifier AMP1, a second amplifier AMP2, and an analog-to-digital converter AD. The AD further comprises a first DAC capacitor C1 and a second DAC capacitor C2, a first tracking switch S1, a second tracking switch S2, a sampling switch S3, and an ADC control circuit. The switches S1 and S2 are SPDT switches, and the switch S3 is a SPST switch. AMP1 and AMP2 have the same characteristic as given by Equations (2)-(5).

The first and second voltage amplifiers AMP1, AMP2 are electrically coupled in parallel with each other. The first and second voltage amplifiers AMP1, AMP2 have respective inputs 1611, 1612 that are electrically coupled in series to an input line 1620 that has an input voltage $V_{IN}$. The first and second track-and-hold circuits 1601, 1602 can be the same as the first and second track-and-hold circuits 901, 902, the first and second track-and-hold circuits 1601, 1602, and/or the first and second track-and-hold circuits 1601, 1602, respectively. AMP1 and AMP2 can be characterized by Equations (2)-(5).

The first and second track-and-hold circuits 1601, 1602 have a first state in which the outputs 1613, 1614 of the first and second voltage amplifiers AMP1, AMP2 are electrically coupled to a shorting line 1640. In the first state, the first voltage amplifier AMP1 and the first track-and-hold circuit 1601 are electrically coupled in parallel with the second voltage amplifier AMP2 and the second track-and-hold circuit 1602. The first and second track-and-hold circuits 1601, 1602 have a second state in which the outputs 1613, 1614 of the first and second voltage amplifiers AMP1, AMP2 are electrically coupled to first and second feedback lines 1681, 1682, which are electrically coupled to ADC control circuitry 1650.

The sampling switch S3 is electrically coupled to the shorting line 1640. The sampling switch S3 has a first terminal 1661 that is electrically coupled to the shorting line 1640 and a second terminal 1662 that is electrically coupled to ground. The sampling switch S3 has an open state and a closed state and can be an SPST switch.

Thus, the circuit 1600 includes a plurality of voltage amplifiers and track-and-hold circuits that are electrically coupled in parallel with one another. Each track-and-hold circuit has a first state in which the output of the respective voltage amplifier is electrically coupled to a respective feedback line to the shorting line 1640. Each track-and-hold circuit has a second state in which the output of the respective voltage amplifier is electrically coupled to the ADC control circuitry 1650. In FIG. 16, there are 2 voltage amplifiers and 2 track-and-hold circuits. In other embodiments, there can be more 3, 4, 5, or another number (e.g., a positive integer greater than or equal to 2) of voltage amplifiers and track-and-hold circuits that are electrically coupled in parallel with one another and that have first and second states as described above. The input of each set or row of voltage amplifiers and track-and-hold circuits is electrically coupled to the input line 1620.

In one example, the first track-and-hold circuit 1601 includes a first tracking switch S1 and a first sampling capacitor C1 and the second track-and-hold circuit 1602 includes a second tracking switch S2 and a second sampling capacitor C2. The first sampling capacitor C1 has a capacitance of $C_1$, and the second sampling capacitor C2 has a capacitance of $C_2$. A first terminal of each sampling capacitor C1, C2 is electrically coupled to the shorting line 1640. A second terminal of each sampling capacitor C1, C2 is electrically coupled to the respective tracking switch S1, S2. When the track-and-hold circuits 1601, 1602 are in the first state, the tracking switches S1, S2 are in a first state (e.g., thrown to position 1) in which the second terminal of each sampling capacitor C1, C2 is electrically coupled to the respective output 1613, 1614 of the first and second voltage amplifiers AMP1, AMP2. When the track-and-hold circuits 1601, 1602 are in the second state, the tracking switches S1, S2 are in a second state (e.g., thrown to position 2) in which the second terminal of each sampling capacitor C1, C2 is electrically coupled to the respective feedback line 1681, 1682. The tracking switches S1, S2 can be SPDT switches.

Figure 17:
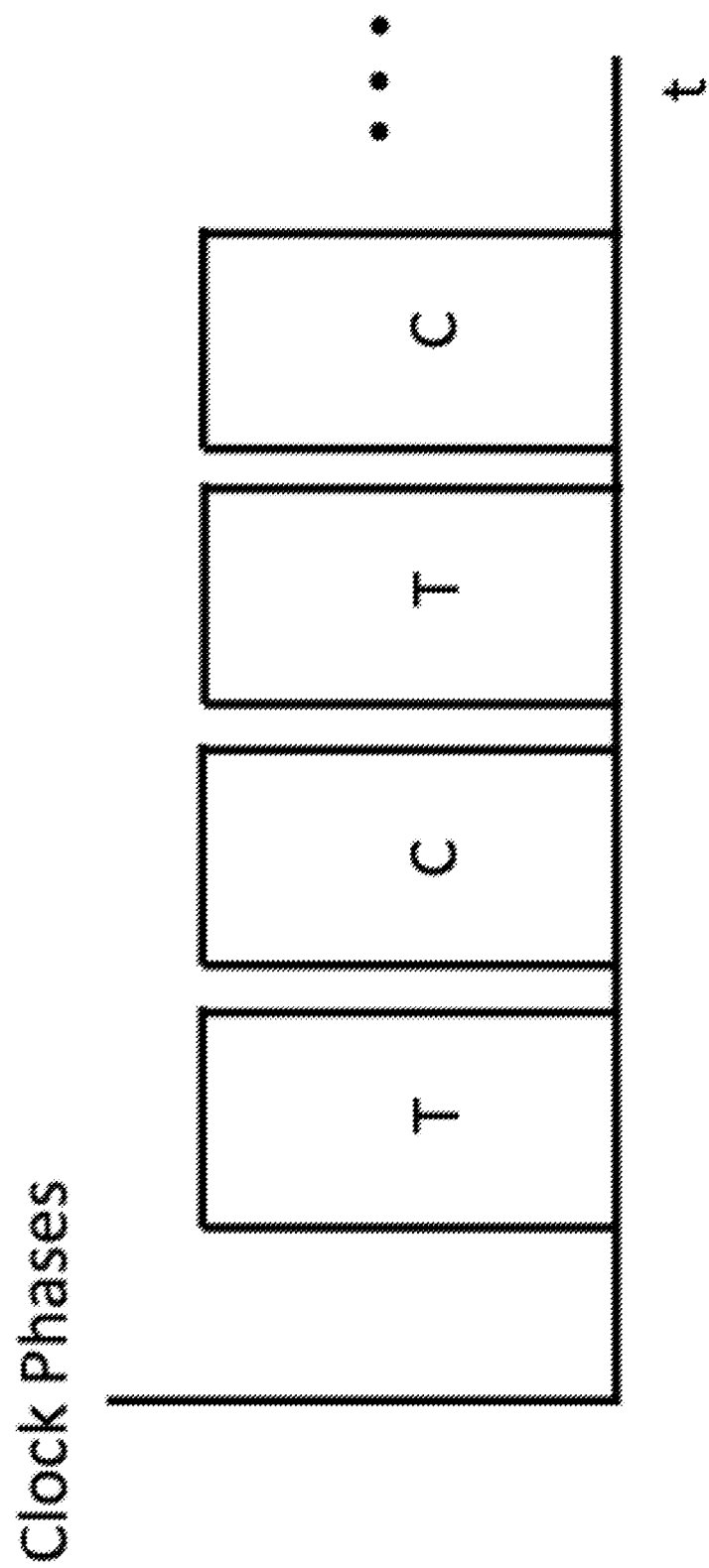
FIG. 17 is a graph of the clock phases of the multipath sampling circuit illustrated in FIG. 16 according to an embodiment.

The circuit 1600 operates in two clock phases as shown in FIG. 17, a tracking phase (T) and a conversion phase (C). During the tracking phase, the first and second track-and-hold circuits 1601, 1602 are in the first state (e.g., tracking switches S1 and S2 are thrown to position 1) and the sampling switch S3 is in the closed state. At the end of the tracking phase, the sampling switch s3 transitions to the open state, then (e.g., after 1-3 gate delays), the first and second track-and-hold circuits 1601, 1602 transition to the second state (e.g., tracking switches S1 and S2 are thrown to position 2) in the conversion phase. The ADC then proceeds to convert the sampled charge in C1 and C2 into a digital output. The voltages applied to position 2 of switches S1 and S2 are controlled by the A/D conversion process and may include reference voltages $V_{REFP}$, $V_{REFN}$, or ground.

Figure 18:
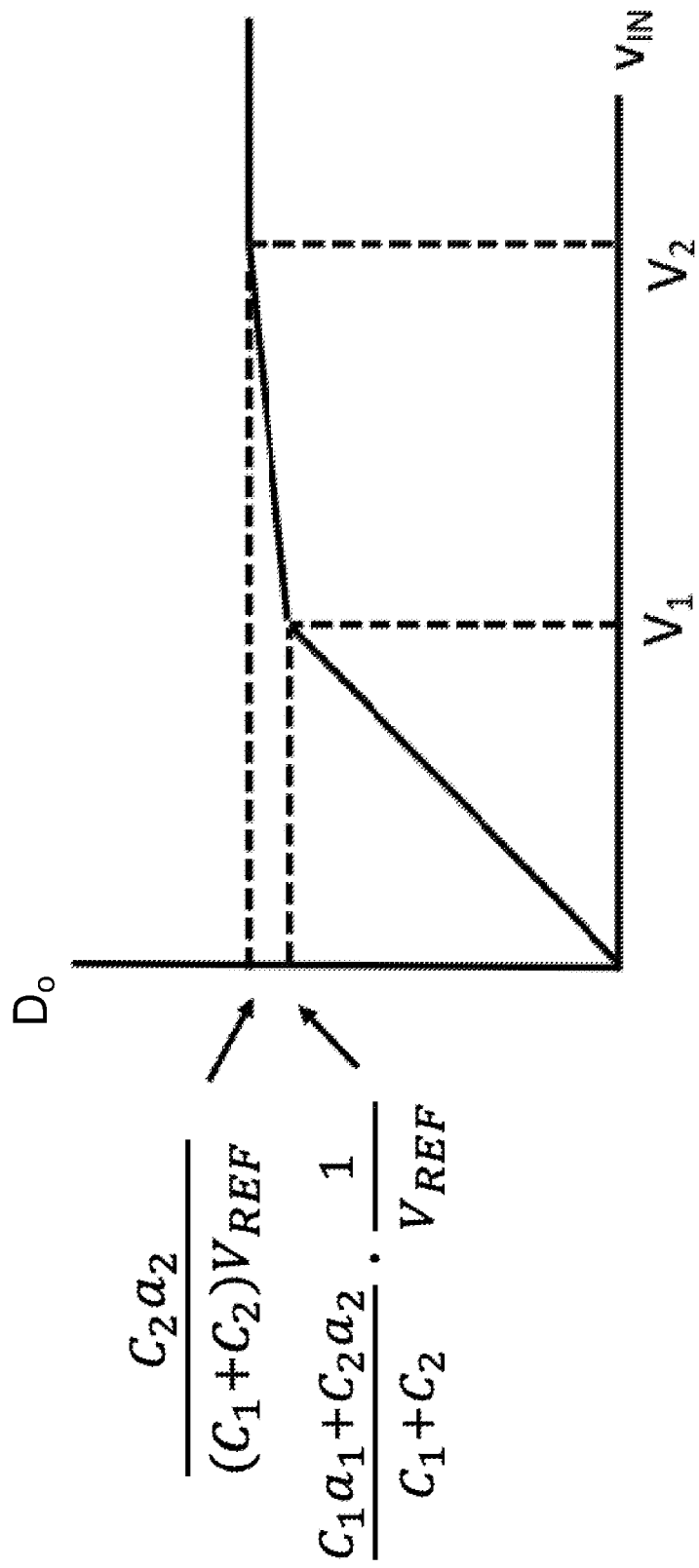
FIG. 18 is a graph of the output voltage of the multipath sampling circuit illustrated in FIG. 16 according to an embodiment.

The digital output $D_o$ at the output 1670 of the ADC can be shown to be:

$$D_O = \frac{C_1 a_1 + C_2 a_2}{C_1 + C_2} \cdot \frac{v_{IN}}{V_{REF}}, v_{IN} < V_1 \qquad (22)$$

$$D_O = \frac{(C_1 a_1 V_1 + C_2 a_2 v_{IN})}{(C_1 + C_2)V_{REF}}, V_1 < v_{IN} < V_2 \qquad (23)$$

$$D_O = \frac{(C_1 a_1 V_1 + C_2 a_2 V_2)}{(C_1 + C_2)V_{REF}}, v_{IN} > V_2 \qquad (24)$$

where $V_{REF}$ is the full-scale voltage of the AD which may be equal to $V_{REFP}$-$V_{REFN}$. These characteristics are graphically illustrated in FIG. 18. The digital output $D_o$ can be shown to be equal to or close to (e.g., proportional to) the values in equations (22)-(24). The digital output increases linearly for the input voltage less than $V_1$ at a gain of $$\frac{C_1 a_1 + C_2 a_2}{C_1 + C_2} \cdot \frac{1}{V_{REF}},$$

and keeps increasing when the input voltage exceeds $V_1$ at a lower incremental gain of $$\frac{C_2 a_2}{(C_1 + C_2)V_{REF}}.$$

For the input voltage greater than $V_2$, the output saturates at $$\frac{(C_1 a_1 V_1 + C_2 a_2 V_2)}{(C_1 + C_2)V_{REF}}.$$

By properly choosing the values of $a_1$, $a_2$, $C_1$, $C_2$, $C_3$, and $V_{REF}$, different breakpoints and incremental gains can be realized. Also, by employing additional sets or rows of voltage amplifiers and track-and-hold circuits that are electrically coupled in parallel with one another, multiple sections of different gain regions may be realized.

In all previous embodiments, the amplifiers AMP1 and AMP2 may be replaced by differential amplifiers whose characteristics are given below by Equations 25-27 for AMP1 and Equations 28-30 for AMP2.

$$v_{o1} = a_1 v_{IN}, |v_{IN}| < V_1 \quad (25)$$

$$v_{o1} = a_1 V_1, v_{IN} \geq V_1 \quad (26)$$

$$v_{o1} = -a_1 V_1, v_{IN} \leq -V_1 \quad (27)$$

$$v_{o2} = a_2 v_{IN}, |v_{IN}| < V_2 \quad (28)$$

$$v_{o2} = a_2 V_2, v_{IN} \geq V_2 \quad (29)$$

$$v_{o2} = -a_2 V_2, v_{IN} \leq -V_2 \quad (30)$$

Figure 19:
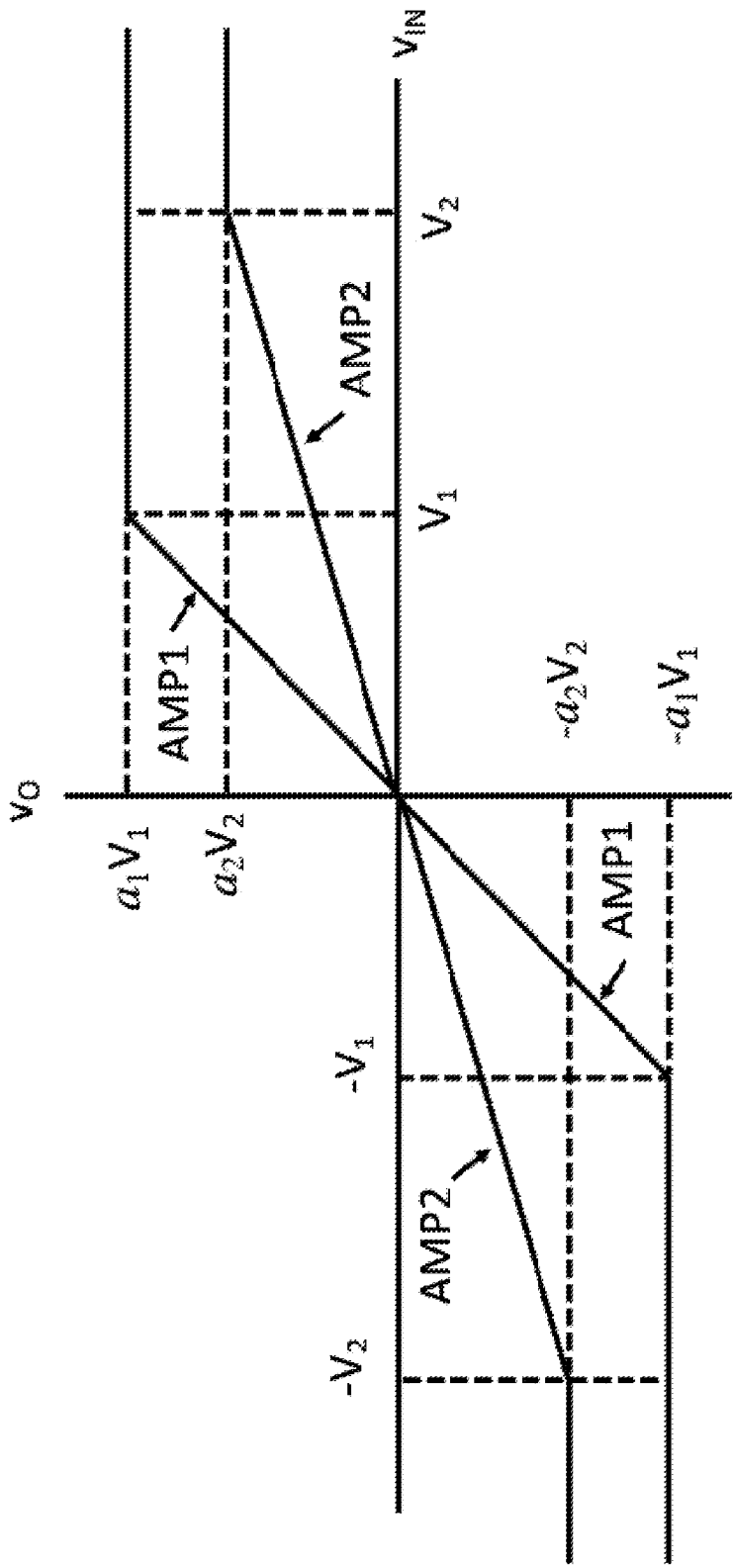
FIG. 19 is a graph of the output voltage of first and second differential voltage amplifiers according to an embodiment.
Figure 20:
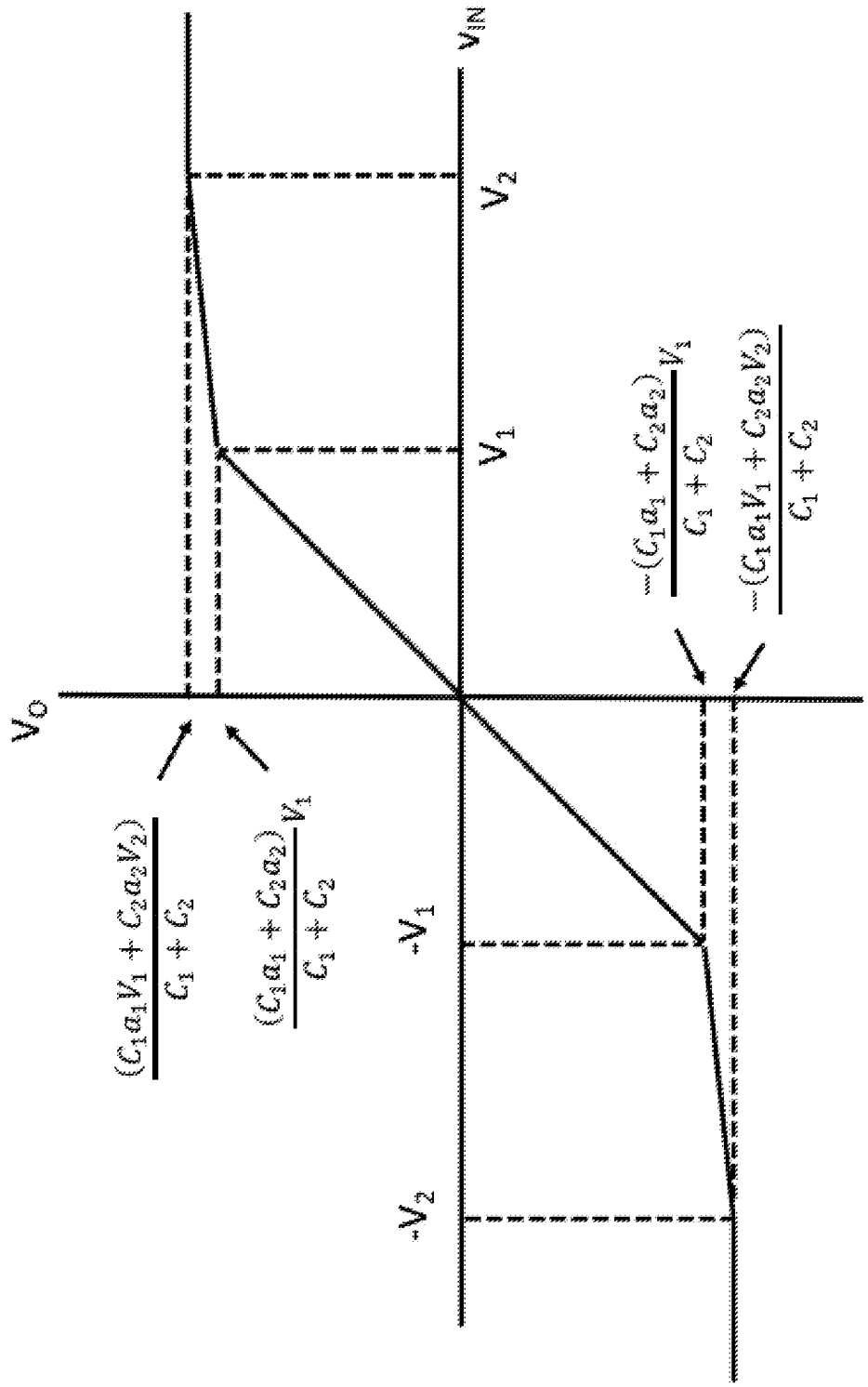
FIG. 20 is a graph of the output voltage of the multipath sampling circuits illustrated in FIGS. 6, 9, and 11 when the first and second voltage amplifiers are replaced with first and second differential voltage amplifiers.

The characteristics of differential amplifiers AMP1 and AMP2 are illustrated in FIG. 19. The differential amplifiers extend the amplifier characteristics to the negative input and output axes. The resulting output voltage of the multipath sampling circuit is also extended to the negative input and output axes, for example, as shown in FIG. 20 for the second through the fourth embodiments (i.e., multipath sampling circuits 60, 90, and 1100).

In systems-on-a-chip (SoCs), fully-differential topologies are often desired to reduce the effect of the power supply, common-mode, and substrate noise.

It is straightforward to convert all embodiments, the first through the seventh embodiments (i.e., multipath sampling circuits 30, 60, 90, 1100, 1200, 1500, and 1600, respectively), to a fully-differential implementation.

Figure 21:
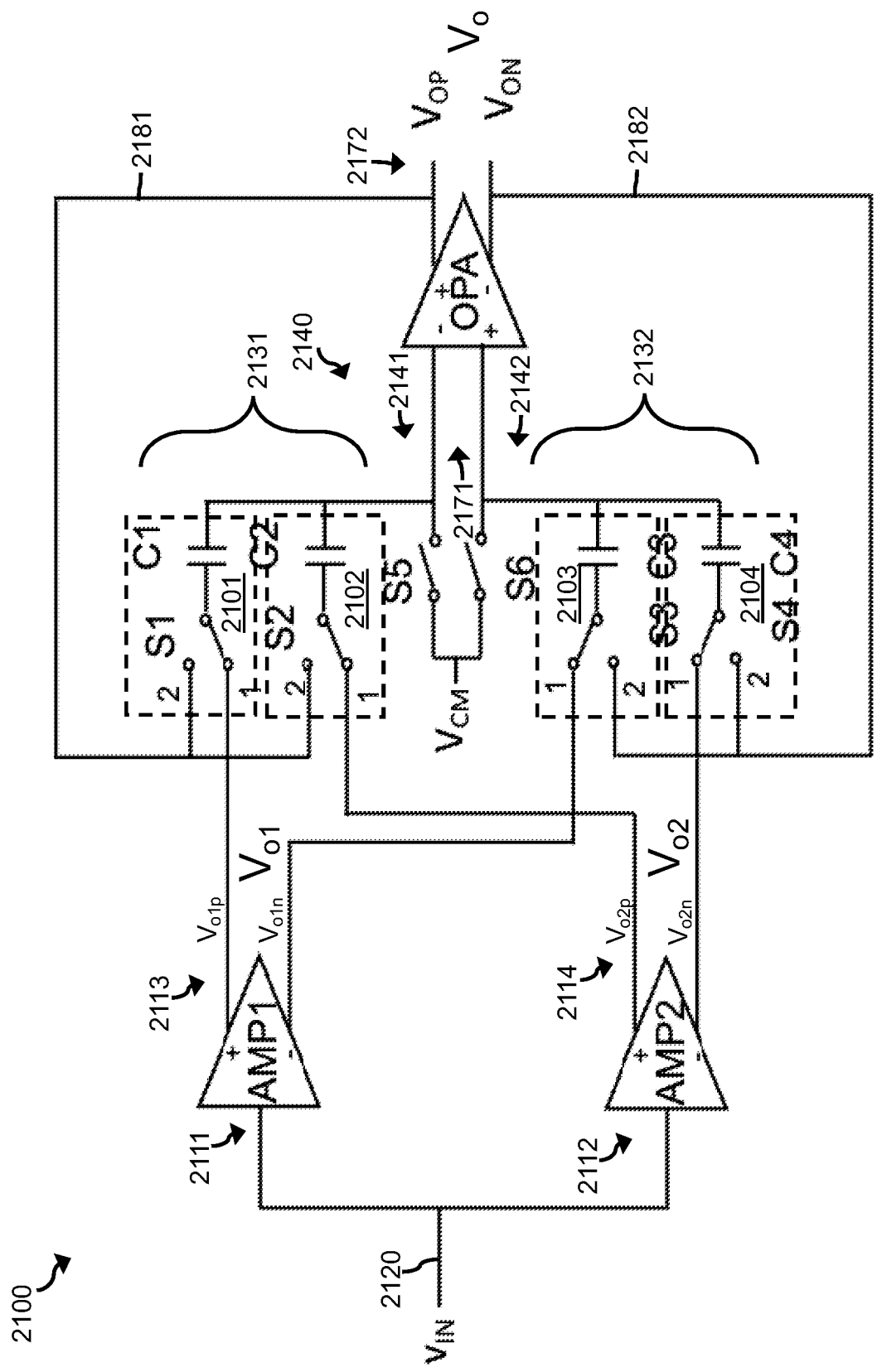
FIG. 21 is a schematic circuit diagram of a multipath sampling circuit according to an eighth embodiment of the invention.

As an illustration of a fully-differential embodiment, FIG. 21 is a schematic circuit diagram of a multipath sampling circuit 2100 according to an eighth embodiment of the invention. Multipath sampling circuit 2100 is a fully-differential implementation of multipath sampling circuit 90 (i.e., the third embodiment). The multipath sampling circuit 2100 comprises a first voltage amplifier AMP1, a second voltage amplifier AMP2, a first track-and-hold circuit 2101, a second track-and-hold circuit 2102, a first track-and-hold circuit 2103, a fourth track-and-hold circuit 2104, first and second sampling switches S5, S6, and an operational amplifier OPA.

The first and second voltage amplifiers AMP1, AMP2 are electrically coupled in parallel with each other. The first and second voltage amplifiers AMP1, AMP2 have respective inputs 2111, 2112 that are electrically coupled in series to an input line 2120 that has an input voltage $V_{IN}$. The track-and-hold circuits 2101-2104 can be the same as any of the track-and-hold circuits described herein. AMP1 and AMP2 can be characterized by Equations (2)-(5). The track-and-hold circuits 2101-2104 are arranged in first and second track-and-hold circuit groups 2131, 2132, respectively. The track-and-hold circuits (e.g., the first and second track-and-hold circuits 2101, 2102) in the first track-and-hold circuit group 2131 are electrically coupled to a first side (e.g., a non-inverting side) of a differential output of the respective voltage amplifiers AMP1, AMP2. The track-and-hold circuits (e.g., the third and fourth track-and-hold circuits 2103, 2104) in the second track-and-hold circuit group 2132 are electrically coupled to a second side (e.g., an inverting side) of the differential output of the respective voltage amplifiers AMP1, AMP2.

The first and second track-and-hold circuits 2101, 2102 have a first state in which a first side (e.g., a non-inverting side) of a differential output 2113, 2114 of the first and second voltage amplifiers AMP1, AMP2 is electrically coupled to a first side 2141 of a sampling circuit 2140. The third and fourth track-and-hold circuits 2103, 2104 have a first state in which a second side (e.g., an inverting side) of the differential output 2113, 2114 of the first and second voltage amplifiers AMP1, AMP2 is electrically coupled to a second side 2142 of the sampling circuit 2140. In the first state, the first voltage amplifier AMP1 and the first and second track-and-hold circuits 2101, 2102 are electrically coupled in parallel with the second voltage amplifier AMP2 and the third and fourth track-and-hold circuits 2103, 2104.

The first and second track-and-hold circuits 2101, 2102 have a second state in which the first side (e.g., the non-inverting side) of the differential output 2113, 2114 of the first and second voltage amplifiers AMP1, AMP2 is electrically coupled to a first feedback line 2181 that is electrically coupled to a first side (e.g., a non-inverting side) of a differential output 2172 of the operational amplifier OPA. The third and fourth track-and-hold circuits 2103, 2104 have a second state in which the second side (e.g., the inverting side) of the differential output 2113, 2114 of the first and second voltage amplifiers AMP1, AMP2 is electrically coupled to a second feedback line 2182 that is electrically coupled to a second side (e.g., an inverting side) of the differential output 2172 of the operational amplifier OPA.

The first sampling switch S5 is electrically coupled to the first side 2141 of the sampling circuit 2140. The second sampling switch S6 is electrically coupled to the second side 2142 of the sampling circuit 2140. The sampling switches S5, S6 have an open state and a closed state, and can be SPST switches. When both sampling switches S5, S6 are in the closed state, the first and second sides 2141, 2142 of the sampling circuit 2140 are electrically coupled to receive a system common-mode voltage $V_{CM}$. The first side 2141 of the sampling circuit 2140 is electrically coupled to a first side (e.g., an inverting side) of a differential input 2171 of the operational amplifier OPA. The second side 2142 of the sampling circuit 2140 is electrically coupled to a second side (e.g., a non-inverting side) of the differential input 2171 of the operational amplifier OPA.

Thus, the circuit 2100 includes a plurality of voltage amplifiers and track-and-hold circuits that are electrically coupled in parallel with one another. A first track-and-hold circuit group is electrically coupled a first side of a differential output of each voltage amplifier. A second track-and-hold circuit group is electrically coupled a second side of the differential output of each voltage amplifier. The track-and-hold circuits in the first track-and-hold circuit group have a first state in which the first side of a differential output of each voltage amplifier is electrically coupled to a first side of a sampling circuit. The track-and-hold circuits in the second track-and-hold circuit group have a first state in which the second side of the differential output of each voltage amplifier is electrically coupled to a second side of a sampling circuit.

The track-and-hold circuits in the first track-and-hold circuit group have a second state in which the first side of the differential output of each voltage amplifier is electrically coupled to a first feedback line that is electrically coupled to a first side of a differential output of an operational amplifier OPA. The track-and-hold circuits in the second track-and-hold circuit group have a second state in which the second side of the differential output of each voltage amplifier is electrically coupled to a second feedback line that is electrically coupled to a second side of the differential output of the operational amplifier OPA. In FIG. 21, there are 2 voltage amplifiers and 2 track-and-hold circuits in each track-and-hold circuit group. In other embodiments, there can be more 3, 4, 5, or another number (e.g., a positive integer greater than or equal to 2) of voltage amplifiers and track-and-hold circuits in each track-and-hold circuit group that are electrically coupled in parallel with one another and that have first and second states as described above. The input of each set or row of voltage amplifiers and track-and-hold circuits is electrically coupled to the input line 2120.

In one example, the first track-and-hold circuit 2101 includes a first tracking switch S1 and a first sampling capacitor C1, the second track-and-hold circuit 2102 includes a second tracking switch S2 and a second sampling capacitor C2, the third track-and-hold circuit 2103 includes a third tracking switch S3 and a third sampling capacitor C3, and the fourth track-and-hold circuit 2104 includes a fourth tracking switch S4 and a fourth sampling capacitor C4. The first and third sampling capacitors C1, C3 can have a capacitance of $C_1$, and the second and fourth sampling capacitors C2, C4 can have a capacitance of C2. A first terminal of each sampling capacitor C1, C2 is electrically coupled to the first side 2141 of the sampling circuit 2140. A second terminal of each sampling capacitor C1, C2 is electrically coupled to the respective tracking switch S1, S2. A first terminal of each sampling capacitor C3, C4 is electrically coupled to the second side 2142 of the sampling circuit 2140. A second terminal of each sampling capacitor C3, C4 is electrically coupled to the respective tracking switch S3, S4.

When the tracking switches S1, S2 are in a first state (e.g., thrown to position 1), the second terminal of each sampling capacitor C1, C2 is electrically coupled to the first side (e.g., the non-inverting side) of the respective differential output 2113, 2114 of the first and second voltage amplifiers AMP1, AMP2. When the tracking switches S3, S4 are in a first state (e.g., thrown to position 1), the second terminal of each sampling capacitor C3, C4 is electrically coupled to the second side (e.g., the inverting side) of the respective differential output 2113, 2114 of the first and second voltage amplifiers AMP1, AMP2.

When the tracking switches S1, S2 are in a second state (e.g., thrown to position 2), the second terminal of each sampling capacitor C1, C2 is electrically coupled to the first feedback line 2181. When the tracking switches S3, S4 are in a second state (e.g., thrown to position 2), the second terminal of each sampling capacitor C3, C4 is electrically coupled to the second feedback line 2182. The tracking switches S1, S2, S3, S4 can be SPDT switches.

The differential output voltage $V_{o1}$ of AMP1 is defined as $$v_{o1} = v_{o1p} - v_{o1n} \quad (31)$$

and the differential output voltage $V_{o2}$ of AMP2 is defined as $$v_{o2} = v_{o2p} - v_{o2n} \quad (32)$$

AMP1 has the following characteristics:

$$v_{o1} = a_1 v_{IN}, |v_{IN}| < V_1 \quad (33)$$

$$v_{o1} = a_1 V_1, v_{IN} \geq V_1 \quad (34)$$

$$v_{o1} = -a_1 V_1, v_{IN} \leq -V_1 \quad (35)$$

and AMP2 has the following characteristics:

$$v_{o1} = a_2 v_{IN}, |v_{IN}| < V_2 \quad (36)$$

$$v_{o1} = a_2 V_2, v_{IN} \geq V_2 \quad (37)$$

$$v_{o1} = a_2 V_2, v_{IN} \leq -V_2 \quad (38)$$

The characteristics of AMP1 and AMP2 are identical to those illustrated in FIG. 19.

The circuit operates in two phases as shown in FIG. 7, a tracking phase (T) and a hold phase (H). During the tracking phase, the tracking switches S1, S2, S3, and S4 are thrown to position 1, and the sampling switches S5 and S6 are closed. At the end of the tracking phase S5 and S6 are opened first, then (e.g., after 1-3 gate delays) the tracking switches S1, S2, S3, and S4 are thrown to position 2.

The output voltage $V_o$ at the output of OPA can be shown to be:

$$V_0 = \frac{(C_1 v_{01} + C_2 v_{02})}{C_1 + C_2} = \frac{(C_1 a_1 + C_2 a_2)}{C_1 + C_2} v_{IN}, |V_{IN}| < V_1 \quad (39)$$

$$V_0 = \frac{(C_1 a_1 V_1 + C_2 a_2 V_{IN})}{C_1 + C_2}, V_1 < |V_{IN}| < V_2 \quad (40)$$

$$V_0 = \frac{(C_1 a_1 V_1 + C_2 a_2 V_2)}{C_1 + C_2}, |v_{IN}| > V_2 \quad (41)$$

This characteristic is identical to that illustrated in FIG. 20. As shown in FIG. 20, the output voltage $V_o$ increases linearly for the input voltage between $-V_1$ and $+V_1$ at a gain of $$\frac{(C_1 a_1 + C_2 a_2)}{C_1 + C_2}.$$

The output voltage $v_o$ keeps increasing when the input voltage is between $+V_1$ and $+V_2$ as well as when the input voltage is between $-V_1$ and $-V_2$, at a lower incremental gain of $$\frac{C_2 a_2}{C_1 + C_2}.$$

For the input voltage greater than $+V_2$ and less than $-V_2$, the output voltage $V_o$ saturates at $$\frac{(C_1 a_1 V_1 + C_2 a_2 V_2)}{C_1 + C_2}$$

and $$-\frac{(C_1 a_1 V_1 + C_2 a_2 V_2)}{C_1 + C_2},$$

respectively. By properly choosing the values of $a_1$, $a_2$, $C_1$ and $C_2$, different breakpoints and incremental gains can be realized. Also, by employing plurality of amplifiers, switches, and sampling capacitors, multiple sections of different gain regions may be realized.

The inventor has also recognized the benefits of employing different frequency responses in AMP1 and AMP2 of the various embodiments described. For example, a ninth embodiment according to the present invention utilizes the same structure as circuit 60 for the second embodiment of the invention, but the input voltage $V_{IN}$ is an AC voltage. The DC characteristics of AMP1 and AMP2 are also identical to those of the first embodiment as given by Equations (2)-(5). However, for AMP1, in its linear region of operation (i.e., $V_{IN} < V_1$), its frequency response is given by:

$$V_{o1} = a_1 H_1(s) V_{in} \quad (42)$$

where $V_{in}$ represents the AC magnitude and phase of the input voltage $V_{IN}$ in a polar format and $V_{o1}$ represents the AC magnitude and phase of the output voltage $v_{o1}$ of AMP1 in a polar format. $H_1$ is a Laplace-domain transfer function of AMP1.

Also, for AMP2, in its linear region of operation (i.e., $V_{IN} < V_2$), its frequency response is given by:

$$V_{o2} = a_2 H_2(s) V_{in} \quad (43)$$

where $V_{o2}$ represents the AC magnitude and phase of the output voltage $v_{o2}$ of AMP2 in a polar format. $H_2$ is a Laplace-domain transfer function of AMP2.

It can be shown that when both AMP1 and AMP2 are in the linear region, (i.e., $V_{IN} < V_1, V_2$), the output voltage of $V_o$ has a composite frequency response of:

$$V_0 = \frac{(C_1 a_1 H_1(s) + C_2 a_2 H_2(s))}{C_1 + C_2} V_{in} \quad (44)$$

Note that Equation (44) is a continuous-time approximation of output voltage, which is discrete-time. As an example, with $$H_1(s) = \frac{T_1 s}{1 + T_1 s} \quad (45)$$

and $$H_2(s) = 1 \quad (46)$$

where $T_1$ represents a time-constant of the transfer function $H_1$.
The input-output relation is given by $$\frac{V_0}{V_{IN}} = \frac{C_2 a_2}{C_1 + C_2} \cdot \frac{1 + \left(1 + \frac{a_1 C_1}{a_2 C_2} T_1\right) s}{1 + T_1 s} \quad (47)$$

The input-output relation can be rewritten as follows:

$$V_0 = \frac{C_2 a_2}{C_1 + C_2} \cdot \frac{1 + \left(1 + \frac{a_1 C_1}{a_2 C_2} T_1\right) s}{1 + T_1 s} V_{IN} \quad (48)$$

By properly choosing the values of $T_1$, $a_1$, $a_2$, $C_1$ and $C_2$, different pole zero locations can be realized.

A tenth embodiment of the present invention employs an identical structure as circuit 90 for the third embodiment of the invention, but the input voltage $V_{IN}$ is an AC voltage. The DC characteristics of AMP1 and AMP2 are identical to those of the first embodiment (i.e., circuit 30) and are given by Equations (2)-(5). AMP1 and AMP2 also have the same frequency responses given by Equations (42) and (43). The input-output relation for this embodiment when both AMP1 and AMP2 are in the linear region, (i.e., $V_{IN} < V_1, V_2$), is given by Equation 48.

An eleventh embodiment of the present invention employs an identical structure as circuit 1100 for the fourth embodiment of the invention, but the input voltage $V_{IN}$ is an AC voltage. The DC characteristics of AMP1 and AMP2 are identical to those of the first embodiment (i.e., circuit 30) and are given by Equations (2)-(5). AMP1 and AMP2 also have the same frequency responses given by Equations (42) and (43). The input-output relation for this embodiment when both AMP1 and AMP2 are in the linear region, (i.e., $V_{IN} < V_1, V_2$), is given by Equation 48.

A twelfth embodiment of the present invention employs an identical structure as circuit 1200 for the fifth embodiment of the invention, but the input voltage $V_{IN}$ is an AC voltage. The DC characteristics of AMP1 and AMP2 are identical to those of the first embodiment (i.e., circuit 30) and are given by Equations (2)-(5). AMP1 and AMP2 also have the same frequency responses given by Equations (42) and (43). The input-output relation for this embodiment when both AMP1 and AMP2 are in the linear region, (i.e., $V_{IN} < V_1, V_2$), is given by Equation 48.

A thirteenth embodiment of the present invention employs an identical structure as circuit 1500 for the sixth embodiment, but the input voltage $V_{IN}$ is an AC voltage. The DC characteristics of AMP1 and AMP2 are identical to those of the first embodiment (i.e., circuit 30) and are given by Equations (2)-(5) while AMP1 and AMP2 also have the same frequency responses given by Equations (42) and (43). The input-output relation for this embodiment when both AMP1 and AMP2 are in the linear region, (i.e., $V_{IN} < V_1, V_2$), is given by Equation 49.

$$V_0 = \frac{C_1 a_1 + C_2 a_2}{C_3} \cdot \frac{1 + \left(1 + \frac{a_1 C_1}{a_2 C_2} T_1\right) s}{1 + T_1 s} V_{IN} \quad (49)$$

A fourteenth embodiment of the present invention employs an identical structure as circuit 1600 for the seventh embodiment, but the input voltage $V_{IN}$ is an AC voltage. The DC characteristics of AMP1 and AMP2 are identical to those of the first embodiment (i.e., circuit 30) given by Equations (2)-(5) while AMP1 and AMP2 also have the same frequency responses given by Equations ((42) and (43). The input-output relation for this embodiment when both AMP1 and AMP2 are in the linear region, (i.e., $V_{IN} < V_1, V_2$), is given by Equation 50.

$$D_0 = \frac{C_2 a_2}{C_1 + C_2} \cdot \frac{1 + \left(1 + \frac{a_1 C_1}{a_2 C_2} T_1\right) s}{1 + T_1 s} \cdot \frac{v_{IN}}{V_{REF}} \quad (50)$$

A fifteenth embodiment of the present invention employs an identical structure as circuit 2100 for the eighth embodiment, but the input voltage $V_{IN}$ is an AC voltage. The DC characteristics of AMP1 and AMP2 identical to those of the eighth embodiment (i.e., circuit 2100) and are given by Equations (33)-(38), while AMP1 and AMP2 also have the same frequency responses given by Equations (42) and (43). The input-output relation for this embodiment when both AMP1 and AMP2 are in the linear region, (i.e., $V_{IN} < V_1, V_2$), is given by Equation 48.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain, using no more than routine experimentation, many equivalents to the specific inventive embodiments described herein. As a specific example, it may be desired to use PMOS transistors in the current memory circuits instead of the NMOS input transistors as shown in the example figures. Such "flipped" configurations will be appreciated by those who are skilled in the art. It is, therefore, to be understood that the foregoing embodiments are presented by way of example only and that, within the scope of the appended claims and equivalents thereto, inventive embodiments may be practiced otherwise than as specifically described. Inventive embodiments of the present disclosure are directed to each individual feature, system, article, material, kit, and/or method described herein. In addition, any sensible combination of two or more such features, systems, articles, materials, kits, and/or methods, if such features, systems, articles, materials, kits, and/or methods are not mutually inconsistent, is included within the inventive scope of the present disclosure.

Also, the invention described herein may be embodied as a method. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The invention should not be considered limited to the particular embodiments described above, but rather should be understood to cover all aspects of the invention as fairly set out in the attached claims. Various modifications, equivalent processes, as well as numerous structures to which the invention may be applicable, will be apparent to those skilled in the art to which the invention is directed upon review of this disclosure.

What is claimed is:

1. A multipath sampling circuit comprising:
an input line electrically having an input voltage;
a plurality of voltage amplifiers in parallel electrically with one another, each voltage amplifier having a respective input electrically coupled with the input line, each voltage amplifier having a different gain and a different saturation voltage;
a plurality of track-and-hold circuits;
a shorting line electrically coupled to a respective output of each sample-and-hold circuit;
a shorting switch electrically coupled to the shorting line;
a buffer amplifier having an input electrically coupled to the shorting line,
wherein:
the multipath sampling circuit has a tracking phase and a hold phase,
when the multipath sampling circuit is in the tracking phase:
the shorting switch is in an open state, and
the track-and-hold circuits are in a first state in which a respective input of each track-and-hold circuit is electrically coupled to an output of a respective amplifier, and
when the multipath sampling circuit is in the hold phase:
the shorting switch is in a closed state, and
the track-and-hold circuits are in a second state in which the respective input of each track-and-hold circuit is electrically decoupled from the output of the respective amplifier.

2. The circuit of claim 1, further comprising:
a plurality of sampling switches; and
a plurality of sampling capacitors,
wherein:
each track-and-hold circuit includes a respective sampling switch and a respective sampling capacitor,
when the track-and-hold circuits are in the first state, the sampling switches are in a closed state such that each sampling capacitor is electrically coupled to the output of the respective amplifier, and
when the track-and-hold circuits are in the second state, the sampling switches are in an open state such that each sampling capacitor is electrically decoupled from the output of the respective amplifier.

3. The circuit of claim 1, wherein:
the voltage amplifiers include first and second voltage amplifiers,
the track-and-hold circuits include first and second track-and-hold circuits,
the gain of the first voltage amplifier is greater than the gain of the second voltage amplifier, and
the saturation voltage of the first voltage amplifier is lower than the saturation voltage of the second voltage amplifier.

4. The circuit of claim 3, wherein:
the gain of the first voltage amplifier is at least twice the gain of the second voltage amplifier, and
the saturation voltage of the first voltage amplifier is lower than or equal to half of the saturation voltage of the second voltage amplifier.

5. The circuit of claim 3, wherein:
the first track-and-hold circuit includes a first sampling switch and a first sampling capacitor,
the second track-and-hold circuit includes a second sampling switch and a second sampling capacitor,
when the track-and-hold circuits are in the first state, the first and second sampling switches are in a closed state such that the first and second sampling capacitors are electrically coupled to the output of the first and second voltage amplifiers, respectively, and
when the track-and-hold circuits are in the second state, the first and second sampling switches are in an open state such that the first and second sampling capacitors are electrically decoupled from the output of the first and second voltage amplifiers, respectively.

6. The circuit of claim 5, wherein:
when the input voltage ($V_{IN}$) is lower than the saturation voltage ($V_1$) of the first voltage amplifier, a voltage ($V_o$) at an output of the buffer amplifier is equal to $$\frac{(C_1 a_1 + C_2 a_2)}{C_1 + C_2} v_{IN},$$

when $V_{IN}$ is greater than or equal to $V_1$ and less than or equal to the saturation voltage ($V_2$) of the second voltage amplifier, $V_o$ is equal to $$\frac{(C_1 a_1 V_1 + C_2 a_2 v_{IN})}{C_1 + C_2},$$

and
when $V_{IN}$ is greater than $V_2$, $V_o$ is equal to $$\frac{(C_1 a_1 V_1 + C_2 a_2 V_2)}{C_1 + C_2},$$

where:
- $a_1$ is the gain of the first voltage amplifier,
- $a_2$ is the gain of the second voltage amplifier,
- $C_1$ is a capacitance of the first sampling capacitor,
- $C_2$ is a capacitance of the second sampling capacitor, and
- $V_o$ is measured during the hold phase of the multipath sampling circuit.

7. A multipath sampling circuit comprising:
an input line having an input voltage;
a plurality of voltage amplifiers in parallel electrically with one another, each voltage amplifier having a respective input electrically coupled with the input line, each voltage amplifier having a different gain and a different saturation voltage;
a plurality of track-and-hold circuits;
a sampling circuit electrically coupled to a respective output of each sample-and-hold circuit, the sampling circuit including a sampling switch having an open state and a closed state;
an operational amplifier having a differential input and an output, the differential input of the operational amplifier electrically coupled to the shorting line,
wherein:
the multipath sampling circuit has a tracking phase and a hold phase,
when the multipath sampling circuit is in the tracking phase:
the track-and-hold circuits are in a first state in which a respective output of each voltage amplifier is electrically coupled to the shorting line, and
the sampling switch is in the closed state,
when the multipath sampling circuit is in the hold phase:
the track-and-hold circuits are in a second state in which the respective output of each voltage amplifier is electrically decoupled from the shorting line, and
the sampling switch is in the open state.

8. The circuit of claim 7, wherein:
the sampling circuit is electrically coupled to an inverting side of the differential input, and
a non-inverting side of the differential input is electrically coupled to ground.

9. The circuit of claim 7, wherein:
the voltage amplifiers include first and second voltage amplifiers,
the track-and-hold circuits include first and second track-and-hold circuits,
the gain of the first voltage amplifier is greater than the gain of the second voltage amplifier, and
the saturation voltage of the first voltage amplifier is lower than the saturation voltage of the second voltage amplifier.

10. The circuit of claim 9, wherein:
the first track-and-hold circuit includes a first tracking switch and a first sampling capacitor,
the second track-and-hold circuit includes a second tracking switch and a second sampling capacitor,
when the first and second track-and-hold circuits are in the first state, the first and second tracking switches are in a first state such that the first and second sampling capacitors are electrically coupled to the output of the first and second voltage amplifiers, respectively, and
when the first and second track-and-hold circuits are in the second state, the first and second tracking switches are in a second state such that the first and second sampling capacitors are electrically decoupled from the output of the first and second voltage amplifiers, respectively.

11. The circuit of claim 10, further comprising:
a feedback capacitor having a first terminal electrically coupled to the sampling circuit; and
a ground switch,
wherein:
when the multipath sampling circuit is in the tracking phase, the ground switch is in a first state in which a second terminal of the feedback capacitor is electrically coupled to ground,
when the multipath sampling circuit is in the hold phase:
the first and second tracking switches electrically couple the first and second sampling capacitors, respectively, to ground, and
the ground switch is in a second state in which the second terminal of the feedback capacitor is electrically coupled to a feedback line, the feedback line electrically coupled to the output of the operational amplifier and to the sampling circuit.

12. The circuit of claim 11, wherein:
when the input voltage ($V_{IN}$) is lower than the saturation voltage ($V_1$) of the first voltage amplifier, a voltage ($V_o$) at the output of the operational amplifier is equal to $$\frac{(C_1 a_1 + C_2 a_2)}{C_3} v_{IN},$$

when $V_{IN}$ is greater than or equal to $V_1$ and less than or equal to the saturation voltage ($V_2$) of the second voltage amplifier, $V_o$ is equal to $$\frac{(C_1 a_1 V_1 + C_2 a_2 v_{IN})}{C_3},$$

and
when $V_{IN}$ is greater than $V_2$, $V_o$ is equal to $$\frac{(C_1 a_1 V_1 + C_2 a_2 V_2)}{C_3},$$

where:
- $a_1$ is the gain of the first voltage amplifier,
- $a_2$ is the gain of the second voltage amplifier,
- $C_1$ is a capacitance of the first sampling capacitor,
- $C_2$ is a capacitance of the second sampling capacitor,
- $C_3$ is a capacitance of the feedback capacitor, and
- $V_x$ is measured during the hold phase of the multipath sampling circuit.

13. The circuit of claim 10, wherein the sampling circuit comprises:
a first shorting line electrically coupled to the respective output of each sample-and-hold circuit, the first shorting line electrically coupled to an inverting side of the differential input of the operational amplifier;
a second shorting line that electrically connects a first feedback line to the shorting line; and
the sampling switch has a first terminal electrically connected to a first side of the second shorting line and a second terminal electrically connected to a second side of the second shorting line, wherein:
when the sampling switch is in the closed state, the sampling switch electrically couples the first and second sides of the second shorting line, thereby electrically coupling the inverting side of the differential input of the operational amplifier to the output of the operational amplifier, when the sampling switch is in the open state, the sampling switch electrically decouples the first and second sides of the second shorting line, thereby electrically decoupling the inverting side of the differential input of the operational amplifier to the output of the operational amplifier.

14. The circuit of claim 10, wherein in the second state the first and second tracking switches electrically couple the first and second sampling capacitors to a respective feedback line that is electrically coupled to the output of the operational amplifier.

15. The circuit of claim 14, wherein:
when the input voltage ($V_{IN}$) is lower than the saturation voltage ($V_1$) of the first voltage amplifier, a voltage ($V_o$) at the output of the operational amplifier is equal to $$\frac{(C_1 a_1 + C_2 a_2)}{C_1 + C_2} v_{IN},$$

when $V_{IN}$ is greater than or equal to $V_1$ and less than or equal to the saturation voltage ($V_2$) of the second voltage amplifier, $V_o$ is equal to $$\frac{(C_1 a_1 V_1 + C_2 a_2 v_{IN})}{C_1 + C_2},$$

and
when $V_{IN}$ is greater than $V_2$, $V_o$ is equal to $$\frac{(C_1 a_1 V_1 + C_2 a_2 V_2)}{C_1 + C_2},$$

where:
$a_1$ is the gain of the first voltage amplifier,
$a_2$ is the gain of the second voltage amplifier,
$C_1$ is a capacitance of the first sampling capacitor,
$C_2$ is a capacitance of the second sampling capacitor, and
$V_o$ is measured during the hold phase of the multipath sampling circuit.

16. The circuit of claim 7, wherein the sampling circuit comprises a shorting line electrically coupled to the respective output of each sample-and-hold circuit, the sampling switch electrically coupled to the shorting line, wherein:
when the sampling circuit is in the first state, the sampling switch is in a closed state in which the sampling circuit is electrically coupled to ground, and
when the sampling circuit is in the second state, the sampling switch is in an open state in which the sampling circuit is electrically decoupled from ground.

17. The circuit of claim 7, wherein the plurality of voltage amplifiers have different frequency responses.

18. A multipath sampling circuit comprising:
an input line having an input voltage;
a plurality of voltage amplifiers in parallel electrically with one another, each voltage amplifier having a respective input electrically coupled with the input line, each voltage amplifier having a different gain and a different saturation voltage;
a plurality of track-and-hold circuits including a first track-and-hold circuit group and a second track-and-hold circuit group, each track-and-hold circuit having a respective input and a respective output;
a sampling circuit having a first side electrically coupled to each track-and-hold circuit in the first track-and-hold circuit group and a second side electrically coupled to each sample-and-hold circuit in the second track-and-hold circuit group, the sampling circuit having a first state in which the first and second sides of the sampling circuit are electrically coupled and a second state in which the first and second sides of the sampling circuit are electrically decoupled; and
an operational amplifier having a differential input in which (a) a first side of the differential input of the operational amplifier is electrically coupled to the first side of the sampling circuit and (b) a second side of the differential input of the operational amplifier is electrically coupled to the second side of the sampling circuit, wherein:
the multipath sampling circuit has a tracking phase and a hold phase,
when the multipath sampling circuit is in the tracking phase:
the track-and-hold circuits in the first track-and-hold circuit group are in a first state in which a first side of a differential output of each voltage amplifier is electrically coupled to the first side of the sampling circuit,
the track-and-hold circuits in the first track-and-hold circuit group are in a first state in which a second side of the differential output of each voltage amplifier is electrically coupled to the second side of the sampling circuit, and
the sampling circuit is in the first state,
when the multipath sampling circuit is in the hold phase:
the respective input of each track-and-hold circuit in the first track-and-hold circuit group is electrically coupled to a first feedback line that is electrically coupled to a first side of a differential output of the operational amplifier,
the respective input of each track-and-hold circuit in the second track-and-hold circuit group is electrically coupled to a second feedback line that is electrically coupled to a second side of the differential output of the operational amplifier, and
the sampling circuit is in the second state.

19. The circuit of claim 18, wherein:
the voltage amplifiers include first and second voltage amplifiers,
the first track-and-hold circuit group includes first and second track-and-hold circuits,
the second track-and-hold circuit group includes third and fourth track-and-hold circuits,
the gain of the first voltage amplifier is greater than the gain of the second voltage amplifier, and the saturation voltage of the first voltage amplifier is less than the saturation voltage of the second voltage amplifier.

20. The circuit of claim 19, wherein:
the first track-and-hold circuit includes a first sampling switch and a first sampling capacitor,
the second track-and-hold circuit includes a second sampling switch and a second sampling capacitor,
the third track-and-hold circuit includes a third sampling switch and a third sampling capacitor,
the fourth track-and-hold circuit includes a fourth sampling switch and a fourth sampling capacitor,
when the first, second, third, and fourth track-and-hold circuits are in the first state, the first, second, third, and fourth sampling switches are in a first state such that (a) a respective first terminal of the first and second sampling capacitors is electrically coupled to the first side of the differential output of the first and second voltage amplifiers, respectively and (b) a respective first terminal of the third and fourth sampling capacitors is electrically coupled to the second side of the differential output of the first and second voltage amplifiers, respectively, and
when the first, second, third, and fourth track-and-hold circuits are in the second state, the first and second sampling switches are in a second state such that (a) the respective first terminal of the first and second sampling capacitors is electrically coupled to the first feedback line and (b) the respective first terminal of the third and fourth sampling capacitors is electrically coupled to the second feedback line.

21. The circuit of claim 20, wherein:
the first side of the differential output of the first and second voltage amplifiers is a non-inverting side,
the second side of the differential output of the first and second voltage amplifiers is an inverting side,
when an absolute value of the input voltage ($V_{IN}$) is lower than the saturation voltage ($V_1$) of the first voltage amplifier, a voltage ($V_o$) across the first and second sides of the differential output of the operational amplifier is equal to $$\frac{(C_1 a_1 + C_2 a_2)}{C_1 + C_2} v_{IN},$$

when the absolute value of $V_{IN}$ is greater than or equal to $V_1$ and less than or equal to the saturation voltage ($V_2$) of the second voltage amplifier, $V_o$ is equal to $$\frac{(C_1 a_1 V_1 + C_2 a_2 v_{IN})}{C_1 + C_2},$$

and
when $V_{IN}$ is greater than $V_2$, $V_o$ is equal to $$\frac{(C_1 a_1 V_1 + C_2 a_2 V_2)}{C_1 + C_2},$$

where:
$a_1$ is the gain of the first voltage amplifier,
$a_2$ is the gain of the second voltage amplifier,
$C_1$ is a capacitance of the first and third sampling capacitors,
$C_2$ is a capacitance of the second and fourth sampling capacitors, and
$V_o$ is measured during the hold phase of the track-and-hold circuits.

22. A multipath sampling circuit comprising:
an input line having an input voltage;
a plurality of voltage amplifiers in parallel electrically with one another, each voltage amplifier having a respective input electrically coupled with the input line, each voltage amplifier having a different gain and a different saturation voltage; and
an analog-to-digital converter (ADC) comprising:
a plurality of track-and-hold circuits;
a shorting line electrically coupled to each sample-and-hold circuit;
a plurality of ADC control lines;
a sampling switch having a closed state in which the shorting line is electrically coupled to ground and an open state in which the shorting line is electrically decoupled from ground; and
ADC control circuitry electrically coupled to the shorting line and to the ADC control lines,
wherein:
the ADC has a tracking phase and a conversion phase,
when the ADC is in the tracking phase:
the track-and-hold circuits are in a first state in which a respective output of each voltage amplifier is electrically coupled to the shorting line, and
the sampling switch is in the closed state,
when the ADC is in the conversion phase:
the track-and-hold circuits are in a second state in which the shorting line is electrically coupled to a respective ADC control line, and
the sampling switch is in the open state.

23. The circuit of claim 22, wherein:
the voltage amplifiers include first and second voltage amplifiers,
the track-and-hold circuits include first and second track-and-hold circuits,
the ADC control lines includes first and second ADC control lines,
the gain of the first voltage amplifier is greater than the gain of the second voltage amplifier, and
the saturation voltage of the first voltage amplifier is less than the saturation voltage of the second voltage amplifier.

24. The circuit of claim 23, wherein:
the gain of the first voltage amplifier is at least twice the gain of the second voltage amplifier, and
the saturation voltage of the first voltage amplifier is less than or equal to half of the saturation voltage of the second voltage amplifier.

25. The circuit of claim 23, wherein:
the first track-and-hold circuit includes a first sampling switch and a first sampling capacitor,
the second track-and-hold circuit includes a second sampling switch and a second sampling capacitor,
when the track-and-hold circuits are in the first state, the first and second sampling switches are in a first state in which a respective first terminal of the first and second sampling capacitors is electrically coupled to the respective output of the first and second voltage amplifiers, respectively, and
when the track-and-hold circuits are in the second state, the first and second sampling switches are in a second state in which the respective first terminal of the first and second sampling capacitors is electrically coupled to the first and second ADC control lines, respectively.

26. The circuit of claim 25, wherein:

when the input voltage ($V_{IN}$) is lower than the saturation voltage ($V_1$) of the first voltage amplifier, a digital output ($D_o$) of the ADC control circuitry is equal or close to $$\frac{C_1 a_1 + C_2 a_2}{C_1 + C_2} \cdot \frac{v_{IN}}{V_{REF}},$$

when $V_{IN}$ is greater than or equal to $V_1$ and less than or equal to the saturation voltage ($V_2$) of the second voltage amplifier, $D_o$ is equal or close to $$\frac{(C_1 a_1 V_1 + C_2 a_2 v_{IN})}{(C_1 + C_2) V_{REF}},$$

and when $V_{IN}$ is greater than $V_2$, $D_o$ is equal or close to $$\frac{(C_1 a_1 V_1 + C_2 a_2 V_2)}{(C_1 + C_2) V_{REF}},$$

where:
- $a_1$ is the gain of the first voltage amplifier,
- $a_2$ is the gain of the second voltage amplifier,
- $C_1$ is a capacitance of the first sampling capacitor,
- $C_2$ is a capacitance of the second sampling capacitor,
- $V_{REF}$ is a full-scale voltage of the ADC, and
- $D_o$ is measured during the conversion phase of the ADC.

27. A multipath sampling circuit comprising:
an input line electrically having an input voltage;
a plurality of voltage amplifiers in parallel electrically with one another, each voltage amplifier having a respective input electrically coupled with the input line, each voltage amplifier having a different gain and a different saturation voltage;
a plurality of track-and-hold circuits; and
a summing circuit electrically coupled to the track-and-hold circuits,
wherein:
the multipath sampling circuit has a tracking phase and a hold phase,
when the multipath sampling circuit is in the tracking phase, the track-and-hold circuits are in a first state in which a respective input of each track-and-hold circuit is electrically coupled to an output of a respective amplifier, and
when the multipath sampling circuit is in the hold phase, the track-and-hold circuits are in a first state in which the respective input of each track-and-hold circuit is electrically decoupled from the output of the respective amplifier.

28. The circuit of claim 27, wherein:
the voltage amplifiers include first and second voltage amplifiers,
the track-and-hold circuits include first and second track-and-hold circuits,
the first track-and-hold circuit includes a first tracking switch and a first sampling capacitor,
the second track-and-hold circuit includes a second tracking switch and a second sampling capacitor,
when the first and second track-and-hold circuits are in the first state, the first and second tracking switches are in a first state such that the first and second sampling capacitors are electrically coupled to the output of the first and second voltage amplifiers, respectively,
when the first and second track-and-hold circuits are in the second state, the first and second tracking switches are in a second state such that the first and second sampling capacitors are electrically decoupled from the output of the first and second voltage amplifiers, respectively,
the gain of the first voltage amplifier is greater than the gain of the second voltage amplifier, and
the saturation voltage of the first voltage amplifier is lower than the saturation voltage of the second voltage amplifier.

29. The circuit of claim 28, wherein:
the summing circuit includes first and second summing amplifiers and an output summing node,
an input of the first summing amplifier is electrically coupled to an output of the first track-and-hold circuit,
an input of the second summing amplifier is electrically coupled to an output of the second track-and-hold circuit, and
the output summing node is electrically coupled to an output of the first summing amplifier and an output of the second summing amplifier.

30. The circuit of claim 29, wherein:
when the input voltage ($V_{IN}$) is lower than the saturation voltage ($V_1$) of the first voltage amplifier, a voltage ($V_o$) at an output of the output summing node is equal to $(a_1 b_1 + a_2 b_2) V_{IN}$,
when $V_{IN}$ is greater than or equal to $V_1$ and less than or equal to the saturation voltage ($V_2$) of the second voltage amplifier, $V_o$ is equal to $a_1 b_1 V_1 + a_2 b_2 v_{IN}$, and
when $V_{IN}$ is greater than $V_2$, $V_o$ is equal to $a_1 b_1 V_1 + a_2 b_2 V_2$,
where:
- $a_1$ is the gain of the first voltage amplifier,
- $a_2$ is the gain of the second voltage amplifier,
- $b_1$ is a voltage scale factor of the first summing amplifier,
- $b_2$ is a voltage scale factor of the second summing amplifier, and
- $V_o$ is measured during the hold phase of the multipath sampling circuit.

* * * * *